(12) United States Patent
Kim

(10) Patent No.: US 12,745,510 B2
(45) Date of Patent: Sep. 22, 2026

(54) DISPLAY DEVICE

(71) Applicant: Samsung Display Co., Ltd., Yongin-Si (KR)

(72) Inventor: Keunwoo Kim, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1194 days.

(21) Appl. No.: 17/536,481

(22) Filed: Nov. 29, 2021

(65) Prior Publication Data

US 2022/0310733 A1 Sep. 29, 2022

(30) Foreign Application Priority Data

Mar. 29, 2021 (KR) ........................ 10-2021-0040718

(51) Int. Cl.

*G09G 3/32* (2016.01)
*H10K 59/121* (2023.01)
*H10K 59/131* (2023.01)

(52) U.S. Cl.

CPC ..... *H10K 59/1213* (2023.02); *H10K 59/1216* (2023.02); *H10K 59/131* (2023.02)

(58) Field of Classification Search

CPC ........... H10K 59/1213; H10K 59/1216; H10K 59/131; H10K 59/121; G09G 2300/0417; G09G 2300/0426; G09G 2300/0819; G09G 2300/0842; G09G 2300/0861; G09G 2320/0238; G09G 3/3233; G09G 3/3225; G09G 3/3266; G09G 3/3275;

(Continued)

(56) References Cited

U.S. PATENT DOCUMENTS 10,482,817 B2 11/2019 Kim et al.
11,380,263 B2 7/2022 Yoon et al.

(Continued)

FOREIGN PATENT DOCUMENTS

CN 105612620 A 5/2016
CN 108154846 A 6/2018

(Continued)

OTHER PUBLICATIONS

Partial European Search Report for Application No. 22162474.5-1207 dated Jul. 7, 2022.

*Primary Examiner* — Chanh D Nguyen
*Assistant Examiner* — Jarurat Suteerawongsa
(74) *Attorney, Agent, or Firm* — CANTOR COLBURN LLP

(57) ABSTRACT

A display device includes a plurality of pixels each including: a first driving transistor including a first electrode connected to a first node; a second electrode connected to a second node, and a gate electrode connected to a third node, a second driving transistor including a first electrode connected to a fourth node, a second electrode connected to the first node, a gate electrode connected to the third node, and a lower gate electrode which receives an emission control signal; a second transistor including a first electrode which receives a data voltage, a second electrode connected to the first node, and a gate electrode which receives a write gate signal; and a third transistor including a first electrode connected to the second node, a second electrode connected to the third node, and a gate electrode which receives the write gate signal or a compensation gate signal.

14 Claims, 19 Drawing Sheets

(58) Field of Classification Search
CPC .. G09G 2300/043; G09G 3/32; H10D 86/431; H10D 86/441; H10D 86/60; H10D 86/40
See application file for complete search history.

(56) References Cited

U.S. PATENT DOCUMENTS

| | | | | |
|---|---|---|---|---|
| 2011/0279419 | A1* | 11/2011 | Takemura | G09G 3/3659 345/204 |
| 2015/0130691 | A1 | 5/2015 | Jeon | |
| 2015/0243220 | A1 | 8/2015 | Kim et al. | |
| 2018/0069069 | A1* | 3/2018 | Ebisuno | H10K 59/352 |
| 2019/0189055 | A1* | 6/2019 | Zhang | H10D 86/421 |
| 2019/0305065 | A1 | 10/2019 | Kim et al. | |
| 2019/0371238 | A1* | 12/2019 | Gao | H10K 59/131 |
| 2020/0005708 | A1* | 1/2020 | Hwang | G09G 3/3258 |
| 2020/0143741 | A1* | 5/2020 | Tsuboi | G09G 3/3233 |
| 2020/0320933 | A1* | 10/2020 | Zhou | H10K 59/1213 |
| 2021/0049958 | A1 | 2/2021 | Kim et al. | |
| 2021/0090494 | A1 | 3/2021 | Hwang et al. | |
| 2021/0319747 | A1* | 10/2021 | Jeon | G09G 3/3233 |
| 2023/0119632 | A1* | 4/2023 | Kwon | G09G 3/3233 345/690 |

FOREIGN PATENT DOCUMENTS

| | | | | |
|---|---|---|---|---|
| CN | 108335672 | A | 7/2018 | |
| CN | 110992895 | A | 4/2020 | |
| KR | 1020140082001 | A | 7/2014 | |
| KR | 1020150010523 | A | 1/2015 | |
| KR | 1020160044078 | A | 4/2016 | |
| KR | 20190078750 | A | 7/2019 | |
| KR | 1020190115135 | A | 10/2019 | |
| KR | 1020200000513 | A | 1/2020 | |
| KR | 1020200012062 | A | 2/2020 | |
| WO | WO-2020027445 | A1 * | 2/2020 | G09G 3/3233 |

* cited by examiner

FIG. 14

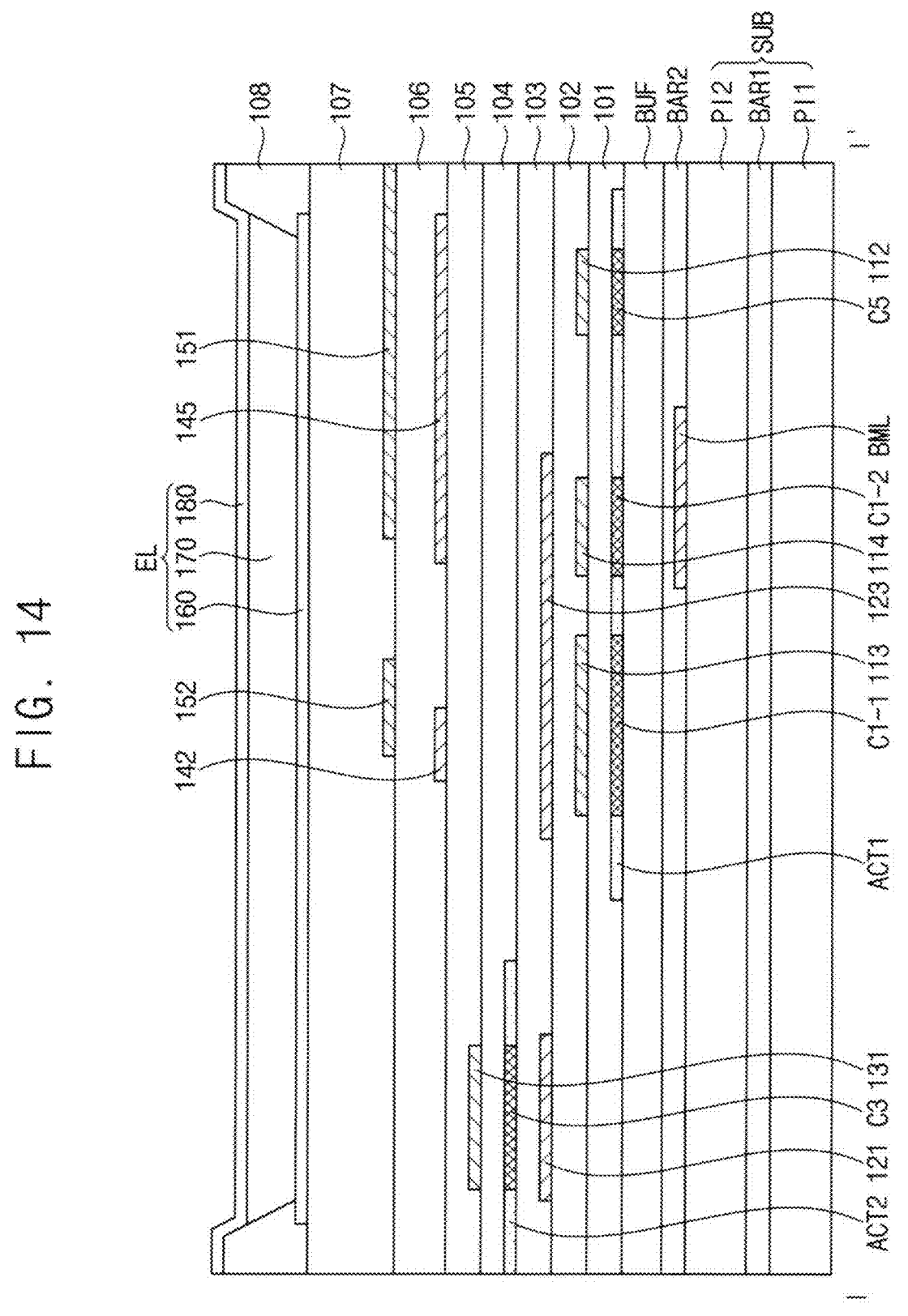

108 107 106 105 104 103 102 101 BUF BAR2 PI2 BAR1 SUB PI1 I'

151 145 EL 160 170 180 152 142

C5 112 BML C1-2 114 123 113 C1-1 ACT1 131 C3 121 ACT2

DISPLAY DEVICE

This application claims priority to Korean Patent Application No. 10-2021-0040718 filed on Mar. 29, 2021, and all the benefits accruing therefrom under 35 U.S.C. § 119, the content of which in its entirety is herein incorporated by reference.

BACKGROUND

1. Field

Embodiments relate to a display device, and more particularly, to a display device including a pixel having multiple driving transistors.

2. Description of the Related Art

A display device may include a plurality of pixels. Each of the pixels may include a plurality of transistors including a driving transistor, a capacitor, a light emitting element, or the like.

When a channel of the driving transistor is short, an on-current of the driving transistor increases, so that the display device may be driven at a high speed. However, as a driving range of the driving transistor is narrowed when the channel of the driving transistor is short, grayscales expressed by the display device may be limited.

As the driving range of the driving transistor is widened when the channel of the driving transistor is long, the display device may express various grayscales. However, as the on-current of the driving transistor decreases when the channel of the driving transistor is long, the driving speed of the display device may be limited.

SUMMARY

Embodiments provide a display device capable of high-speed driving and expression of various grayscales.

A display device according to an embodiment includes a plurality of pixels. Each of the pixels includes: a first driving transistor including a first electrode connected to a first node, a second electrode connected to a second node, and a gate electrode connected to a third node; a second driving transistor including a first electrode connected to a fourth node, a second electrode connected to the first node, a gate electrode connected to the third node, and a lower gate electrode which receives an emission control signal; a second transistor including a first electrode which receives a data voltage, a second electrode connected to the first node, and a gate electrode which receives a write gate signal; and a third transistor including a first electrode connected to the second node, a second electrode connected to the third node, and a gate electrode which receives the write gate signal or a compensation gate signal.

In an embodiment, in a compensation period, the data voltage may be applied to the gate electrode of the first driving transistor along the second transistor, the first driving transistor, and the third transistor in response to the write gate signal or both the write gate signal and the compensation gate signal.

In an embodiment, in the compensation period, a threshold voltage of the first driving transistor may be compensated.

In an embodiment, each of the pixels may further include a fourth transistor including a first electrode which receives a first initialization voltage, a second electrode connected to the third node, and a gate electrode which receives an initialization gate signal.

In an embodiment, in an initialization period, the first initialization voltage may initialize the gate electrode of the first driving transistor and the gate electrode of the second driving transistor in response to the initialization gate signal.

In an embodiment, each of the third transistor and the fourth transistor may be an NMOS transistor.

In an embodiment, each of the third transistor and the fourth transistor may be a PMOS transistor.

In an embodiment, each of the pixels may further include a fifth transistor including a first electrode which receives a driving voltage, a second electrode connected to the fourth node, and a gate electrode which receives the emission control signal.

In an embodiment, the fifth transistor may further include a lower gate electrode which receives the emission control signal.

In an embodiment, each of the pixels may further include a sixth transistor including a first electrode connected to the second node, a second electrode connected to a fifth node, and a gate electrode which receives the emission control signal.

In an embodiment, each of the pixels may further include a light emitting element including a first electrode connected to the fifth node and a second electrode which receives a common voltage.

In an embodiment, in an emission period, the driving voltage may be applied to the first electrode of the light emitting element along the fifth transistor, the second driving transistor, the first driving transistor, and the sixth transistor in response to the emission control signal.

In an embodiment, in the emission period, a threshold voltage of the second driving transistor may be about 0 voltages (V).

In an embodiment, each of the pixels may further include a seventh transistor including a first electrode connected to the fifth node, a second electrode which receives a second initialization voltage, and a gate electrode which receives a bypass gate signal.

In an embodiment, each of the first driving transistor, the second driving transistor, the second transistor, the fifth transistor, the sixth transistor, and the seventh transistor may be a PMOS transistor.

In an embodiment, each of the pixels may further include a storage capacitor including a first electrode connected to the third node and a second electrode which receives a driving voltage.

A display device according to an embodiment includes a plurality of pixels. Each of the pixels includes: a substrate; a lower pattern disposed on the substrate; a first active layer disposed on the lower pattern, where the first active layer includes a first driving channel and a second driving channel and the second driving channel overlaps the lower pattern and is spaced apart from the first driving channel in a plan view; a first gate pattern disposed on the first active layer, the first gate pattern overlapping the first driving channel; a second gate pattern disposed on the same layer as the first gate pattern and spaced apart from the first gate pattern and overlapping the second driving channel; and a capacitor pattern disposed on the first gate pattern and the second gate pattern and overlapping the first gate pattern and the second gate pattern in the plan view.

In an embodiment, a maximum length of the first driving channel may be greater than a maximum length of the second driving channel.

In an embodiment, an area of the first gate pattern may be greater than an area of the second gate pattern in the plan view.

In an embodiment, an area of the capacitor pattern may be greater than a sum of the area of the first gate pattern and the area of the second gate pattern in the plan view.

In an embodiment, each of the pixels may further include: a first compensation gate line disposed on the same layer as the capacitor pattern; a second active layer disposed on the first compensation gate line and including a third channel, where the third channel overlaps the first compensation gate line in the plan view; and a second compensation gate line disposed on the second active layer and overlapping the first compensation gate line in the plan view.

In an embodiment, the first active layer may further include a fifth channel spaced apart from the first driving channel and the second driving channel. Each of the pixels may further include an emission control line disposed on the same layer as the first gate pattern and overlapping the fifth channel in the plan view.

In an embodiment, the lower pattern may include an extending portion overlapping the fifth channel.

In an embodiment, the substrate may include at least one organic insulation layer.

In an embodiment, a material of the first active layer may be different from a material of the second active layer.

In an embodiment, the first active layer may include at least one of amorphous silicon and poly silicon. The second active layer may include an oxide semiconductor.

In the pixel of the display device according to the embodiments, since the channel of the first driving transistor is short, the first driving transistor may have a high on-current. Accordingly, the display device may be driven at a high speed.

In the pixel of the display device according to the embodiments, since the channel of the driving transistor including the first driving transistor and the second driving transistor which are connected in series is long, the driving transistor may have a wide driving range. Accordingly, the display device may express various grayscales.

BRIEF DESCRIPTION OF THE DRAWINGS

Illustrative, non-limiting embodiments will be more clearly understood from the following detailed description taken in conjunction with the accompanying drawings.

FIG. 14 is a cross-sectional view illustrating the pixel taken along line I-I' in FIG. 5.

FIG. 18 is a cross-sectional view illustrating the pixel taken along line II-IF in FIG. 16.

DETAILED DESCRIPTION

Figure 1:
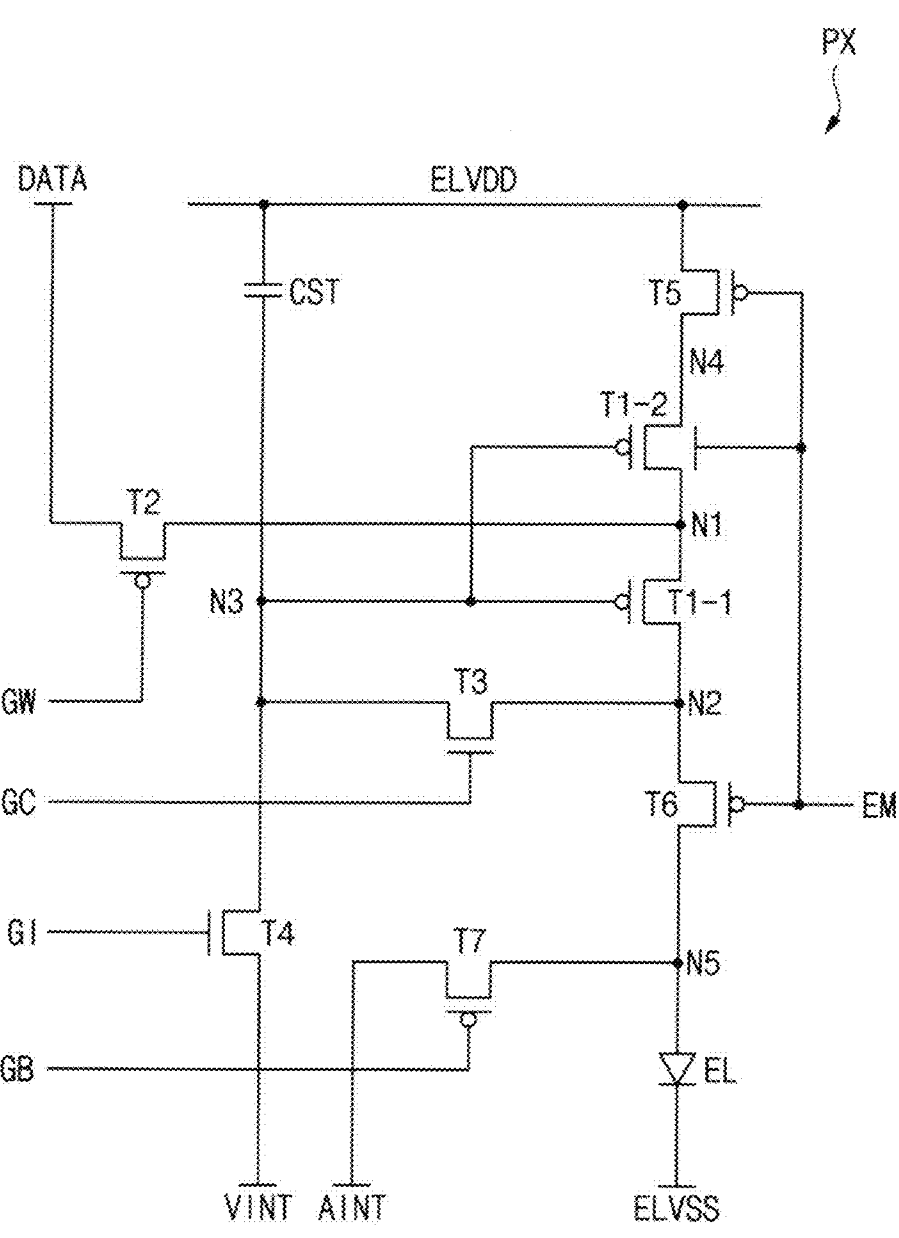
FIG. 1 is a circuit diagram illustrating a pixel of a display device according to an embodiment.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Hereinafter, display devices in accordance with embodiments will be explained in detail with reference to the accompanying drawings.

FIG. 1 is a circuit diagram illustrating a pixel PX of a display device according to an embodiment.

Referring to FIG. 1, a display device includes a plurality of pixels PX. Each pixel PX may mean a single area defined by partitioning a display area on a plane for color display, and one pixel PX may display one predetermined basic color. In other words, one pixel PX may be a minimum unit capable of displaying a color independent of other pixels PX.

The pixel PX may include a plurality of transistors, a storage capacitor CST, and a light emitting element EL. In an embodiment, the plurality of transistors may include a first driving transistor T1-1, a second driving transistor T1-2, a second transistor T2, a third transistor T3, a fourth transistor T4, a fifth transistor T5, a sixth transistor T6, and a seventh transistor T7. However, the present invention is not limited thereto, and in another embodiment, the plurality of transistors may include 2 to 7 or 9 or more transistors.

The first driving transistor T1-1 may include a first electrode connected to a first node N1, a second electrode connected to a second node N2, and a gate electrode connected to a third node N3.

The second driving transistor T1-2 may include a first electrode connected to a fourth node N4, a second electrode connected to the first node N1, a gate electrode connected to the third node N3, and a lower gate electrode which receives an emission control signal EM. Accordingly, the second driving transistor T1-2 may be a dual gate transistor.

The second electrode of the second driving transistor T1-2 may be connected to the first electrode of the first driving transistor T1-1, and the gate electrode of the second driving transistor T1-2 may be connected to the gate electrode of the first driving transistor T1-1. Accordingly, the first driving transistor T1-1 and the second driving transistor T1-2 may be connected in series.

The first driving transistor T1-1 and the second driving transistor T1-2 may generate a driving current based on a difference between a data voltage DATA and a driving voltage ELVDD. Accordingly, the first driving transistor T1-1 and the second driving transistor T1-2 may form a driving transistor, together.

The second transistor T2 may include a first electrode which receives the data voltage DATA, a second electrode connected to the first node N1, and a gate electrode which receives a write gate signal GW. The second transistor T2 may transmit the data voltage DATA to the first node N1 in response to the write gate signal GW. Accordingly, the second transistor T2 may be a switching transistor.

The third transistor T3 may include a first electrode connected to the second node N2, a second electrode connected to the third node N3, and a gate electrode which receives a compensation gate signal GC. The third transistor T3 may compensate a threshold voltage of the first driving transistor T1-1 by diode-connecting the second node N2 and the third node N3 in response to the compensation gate signal GC. Accordingly, the third transistor T3 may be a compensation transistor.

The fourth transistor T4 may include a first electrode which receives a first initialization voltage VINT, a second electrode connected to the third node N3, and a gate electrode which receives an initialization gate signal GI. The fourth transistor T4 may initialize the gate electrode of the first driving transistor T1-1 and the gate electrode of the second driving transistor T1-2 in response to the initialization gate signal GI. Accordingly, the fourth transistor T4 may be an initialization transistor.

The fifth transistor T5 may include a first electrode which receives the driving voltage ELVDD, a second electrode connected to the fourth node N4, and a gate electrode which receives the emission control signal EM.

The sixth transistor T6 may include a first electrode connected to the second node N2, a second electrode connected to a fifth node N5, and a gate electrode which receives the emission control signal EM. The fifth transistor T5 and the sixth transistor T6 may transmit the driving current generated by the first driving transistor T1-1 and the second driving transistor T1-2 to the light emitting element EL in response to the emission control signal EM. Accordingly, each of the fifth transistor T5 and the sixth transistor T6 may be an emission control transistor.

The seventh transistor T7 may include a first electrode connected to the fifth node N5, a second electrode which receives a second initialization voltage AINT, and a gate electrode which receives a bypass gate signal GB. In an embodiment, when the pixel PX is included in an N-th pixel row, the bypass gate signal GB may be the same signal as a write gate signal GW applied to an (N+1)-th pixel row. The seventh transistor T7 may initialize a first electrode of the light emitting element EL in response to the bypass gate signal GB. Accordingly, the seventh transistor T7 may be an initialization transistor.

In an embodiment, an active layer of each of the first driving transistor T1-1, the second driving transistor T1-2, the second transistor T2, the fifth transistor T5, the sixth transistor T6, and the seventh transistor T7 may be formed of or include amorphous silicon or polysilicon. An active layer of each of the third transistor T3 and the fourth transistor T4 may be formed of or include an oxide semiconductor. In an embodiment, each of the first driving transistor T1-1, the second driving transistor T1-2, the second transistor T2, the fifth transistor T5, the sixth transistor T6, and the seventh transistor T7 may be a PMOS transistor, and each of the third transistor T3 and the fourth transistor T4 may be an NMOS transistor.

In an embodiment, one of the first electrode and the second electrode of each of the first driving transistor T1-1, the second driving transistor T1-2, the second transistor T2, the third transistor T3, the fourth transistor T4, the fifth transistor T5, the sixth transistor T6, and the seventh transistor T7 may be a source electrode, and the other thereof may be a drain electrode.

The storage capacitor CST may include a first electrode connected to the third node N3 and a second electrode which receives the driving voltage ELVDD. The storage capacitor CST may maintain a voltage of the third node N3 even when the second transistor T2 is turned off, so that the light emitting element EL may emit light.

The light emitting element EL may include the first electrode connected to the fifth node N5 and a second electrode which receives a common voltage ELVSS. In an embodiment, a voltage level of the common voltage ELVSS may be lower than a voltage level of the driving voltage ELVDD. The light emitting element EL may emit light based on the driving current.

Figure 2:
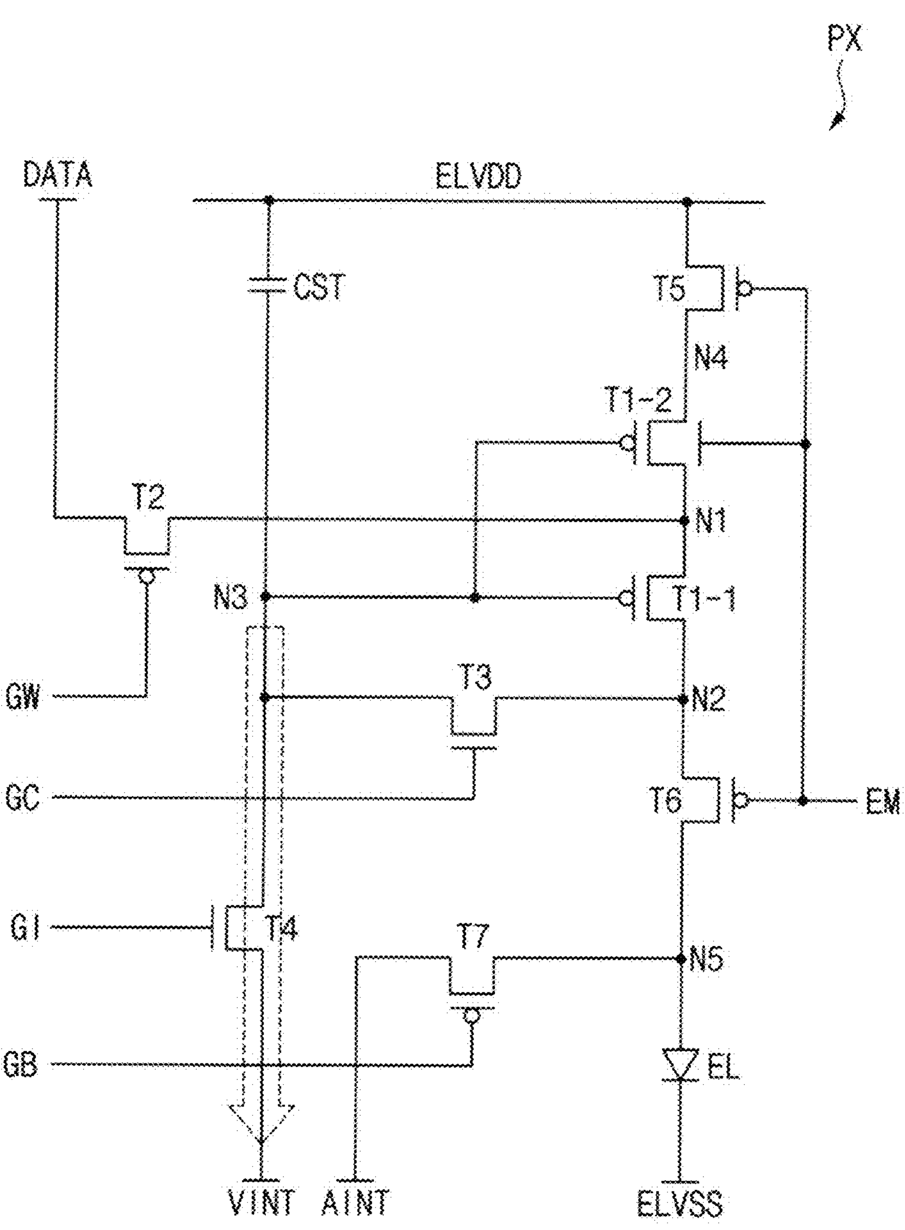
FIGS. 2, 3, and 4 are diagrams for explaining a driving of the pixel in FIG. 1.
Figure 3:
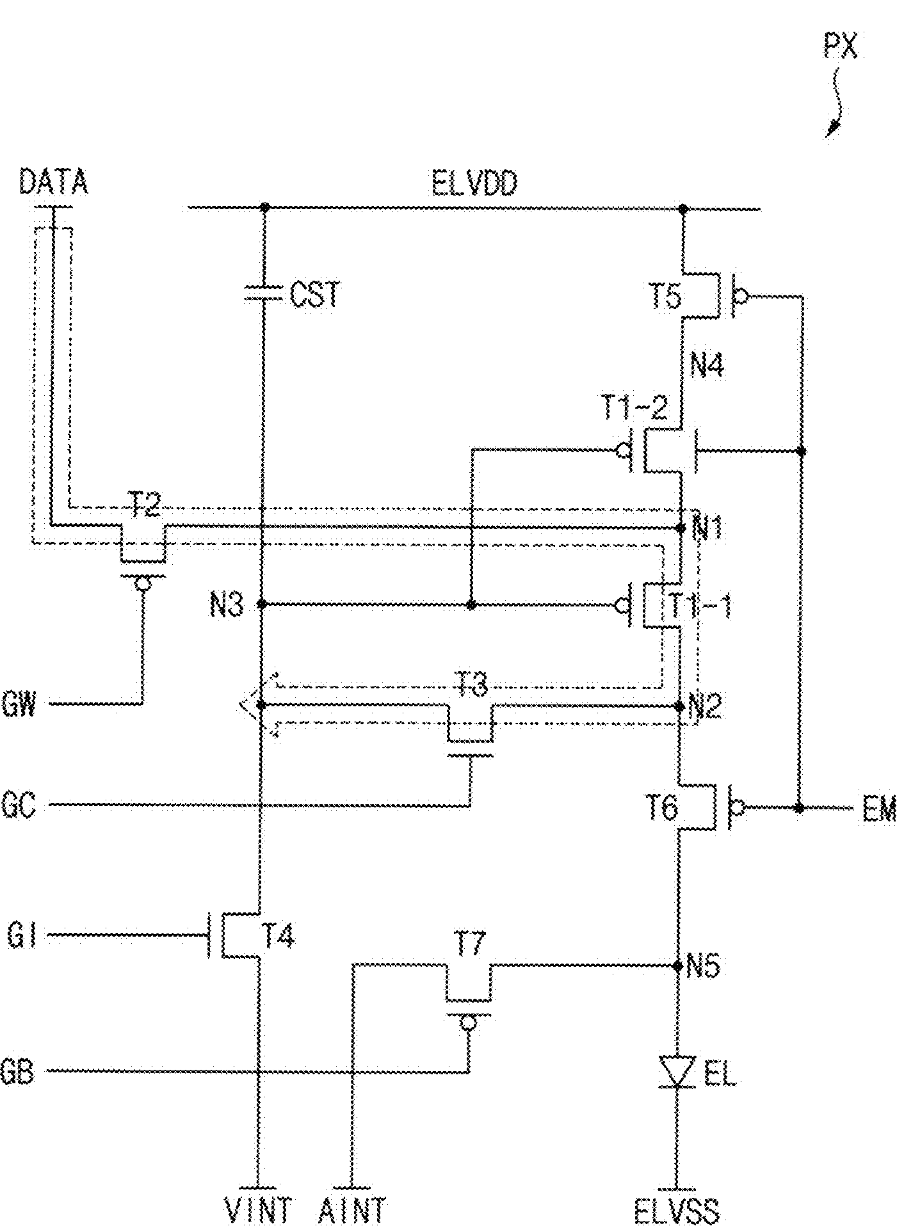
Figure 4:
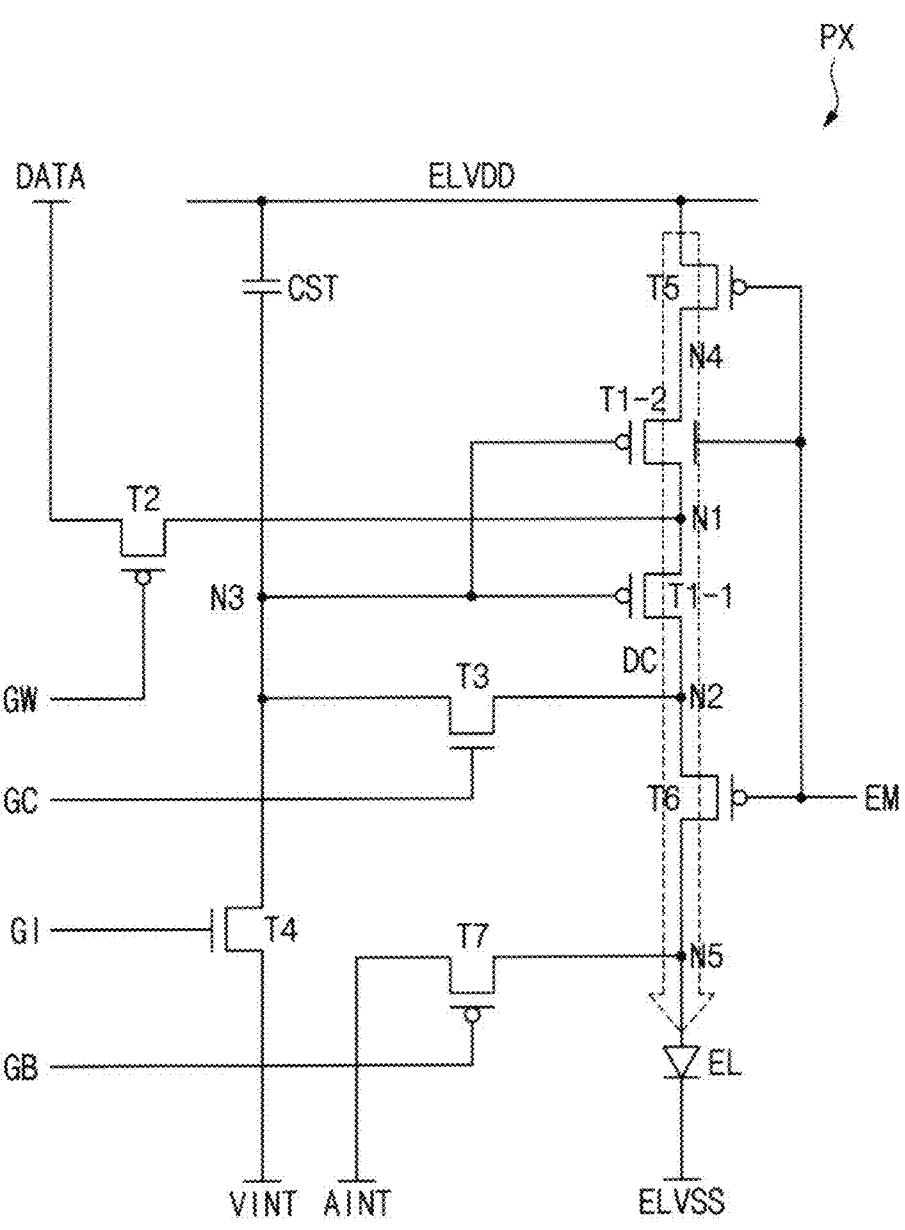

FIGS. 2, 3, and 4 are diagrams for explaining a driving of the pixel PX in FIG. 1.

Referring to FIG. 2, in an initialization period, the first initialization voltage VINT may be applied to the gate electrode of the first driving transistor T1-1 and the gate electrode of the second driving transistor T1-2 in response to the initialization gate signal GI. Specifically, in the initialization period, the initialization gate signal GI of a gate-on level may be applied to the gate electrode of the fourth transistor T4 to turn on the fourth transistor T4, and the first initialization voltage VINT may be applied to the third node N3. Accordingly, the gate electrode of the first driving transistor T1-1 and the gate electrode of the second driving transistor T1-2 may be initialized with the first initialization voltage VINT.

Referring to FIG. 3, in a compensation period, the data voltage DATA may be applied to the gate electrode of the first driving transistor T1-1 along the second transistor T2, the first driving transistor T1-1, and the third transistor T3 in response to the write gate signal GW and the compensation gate signal GC. Specifically, in the compensation period, the write gate signal GW of a gate-on level may be applied to the gate electrode of the second transistor T2 and the compensation gate signal GC of a gate-on level may be applied to the gate electrode of the third transistor T3 to turn on the second transistor T2 and the third transistor T3, respectively, the data voltage DATA may be applied to the third node N3, and the first driving transistor T1-1 may be diode-connected by the third transistor T3. Accordingly, a threshold voltage of the first driving transistor T1-1 may be compensated, and as shown in Equation 1 below, a voltage V(N3) of the third node N3 may correspond to a difference between the data voltage DATA and the threshold voltage Vth(T1-1) of the first driving transistor T1-1.

$$V(N3)=\text{DATA}-|Vth(T1-1)| \quad \text{[Equation 1]}$$

In the prior art, by compensating the threshold voltage of the driving transistor through one driving transistor having a long channel length in the compensation period, an on-current of the driving transistor may be relatively low, and accordingly, a high-speed driving of the display device may be restricted. Here, the "on-current" of a transistor means a current flowing the transistor during on-state of the transistor. However, in the embodiments of the present invention, the driving transistor may be divided into the first driving transistor T1-1 and the second driving transistor T1-2, and among the first driving transistor T1-1 and the second driving transistor T1-2, only the threshold voltage Vth(T1-1) of the first driving transistor T1-1 may be compensated through the first driving transistor T1-1, so that the on-current of the first driving transistor T1-1 may be relatively high, and accordingly, the display device may be driven at a high speed.

Referring to FIG. 4, in an emission period, the driving voltage ELVDD may be applied to the first electrode of the light emitting element EL along the fifth transistor T5, the second driving transistor T1-2, the first driving transistor T1-1, and the sixth transistor T6 in response to the emission control signal EM. Specifically, in the emission period, the emission control signal EM of a gate-on level may be applied to the gate electrode of the fifth transistor T5 and the gate electrode of the sixth transistor T6 to turn on the fifth transistor T5 and the second transistor T6, and the driving voltage ELVDD may be applied to the fifth node N5.

In the emission period, a voltage Vgs(T1-1) between the gate electrode and the source electrode of the first driving transistor T1-1 may correspond to a difference between the voltage V(N3) of the third node N3 and a voltage V(N1) of the first node N1. In this case, as shown in Equation 2 below, the voltage V(N3) of the third node N3 may correspond to the difference between the data voltage DATA and the threshold voltage Vth(T1-1) of the first driving transistor T1-1, and the voltage V(N1) of the first node N1 may correspond to a difference between the driving voltage ELVDD and a threshold voltage Vth(T1-2) of the second driving transistor T1-2.

$$Vgs(T1-1)=\{\text{DATA}-|Vth(T1-1)|\}-\{\text{ELVDD}-|Vth(T1-2)|\}\approx\text{DATA}-|Vth(T1-1)|-\text{ELVDD} \quad \text{[Equation 2]}$$

When the emission control signal EM of the gate-on level is applied to the lower gate electrode of the second driving transistor T1-2 in the emission period, the threshold voltage Vth(T1-2) of the second driving transistor T1-2 may become about 0 voltage (V). Accordingly, as shown in Equation 2 above, the voltage Vgs(T1-1) between the gate electrode and the source electrode of the first driving transistor T1-1 may correspond to a difference between the voltage V(N3) of the third node N3 and the driving voltage ELVDD in the emission period.

As shown in Equation 3 below, the driving current DC generated by the first driving transistor T1-1 may be proportional to a difference between the voltage Vgs(T1) and the threshold voltage Vth(T1-1) of the first driving transistor T1-1. That is, the driving current DC may be proportional to a difference between the data voltage DATA and the driving voltage ELVDD. Accordingly, the first driving transistor T1-1 and the second driving transistor T1-2 may provide the driving current DC independent of the threshold voltage Vth(T1-1) of the first driving transistor T1-1 and the threshold voltage Vth(T1-2) of the second driving transistor T1-2 to the light emitting element EL.

$$DC\propto Vgs(T1-1)-Vth(T1-1)=\text{DATA}-\text{ELVDD} \quad \text{[Equation 3]}$$

In the embodiments of the present invention, by generating the driving current DC through the first driving transistor T1-1 and the second driving transistor T1-2 in the emission period, a driving range of the driving transistor including the first driving transistor T1-1 and the second driving transistor T1-2 may be widened, and accordingly, the display device may express more various grayscales than the prior art that has one driving transistor.

Figure 5:
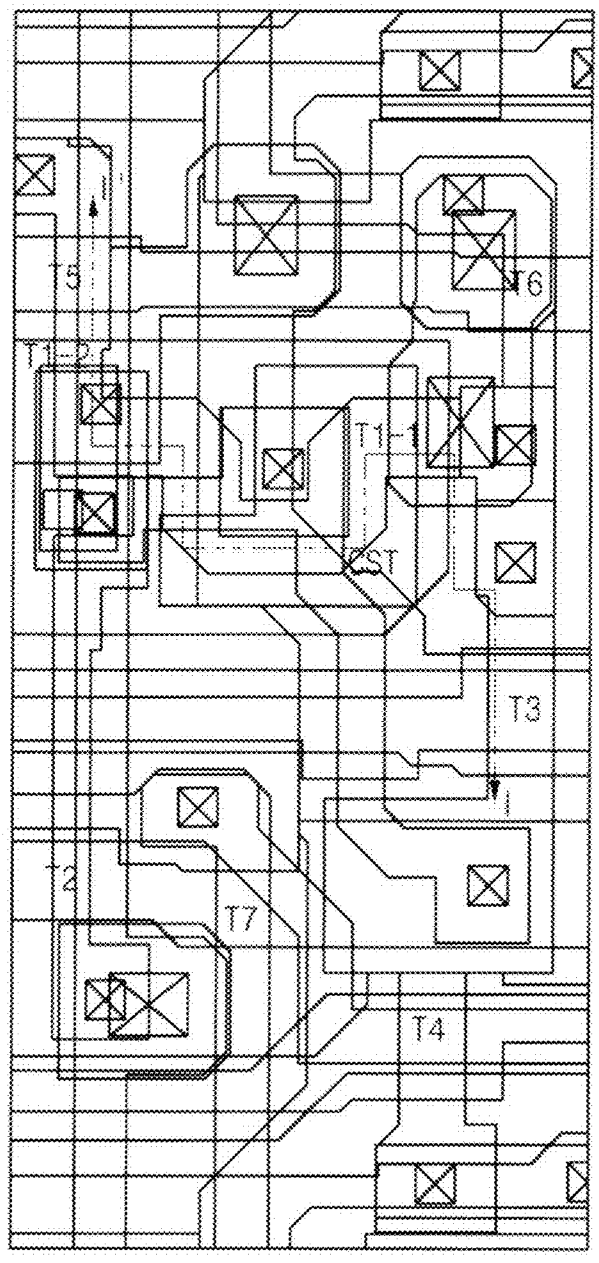
FIG. 5 is a plan view illustrating the pixel in FIG. 1.
Figure 5:
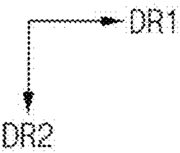
Figure 6:
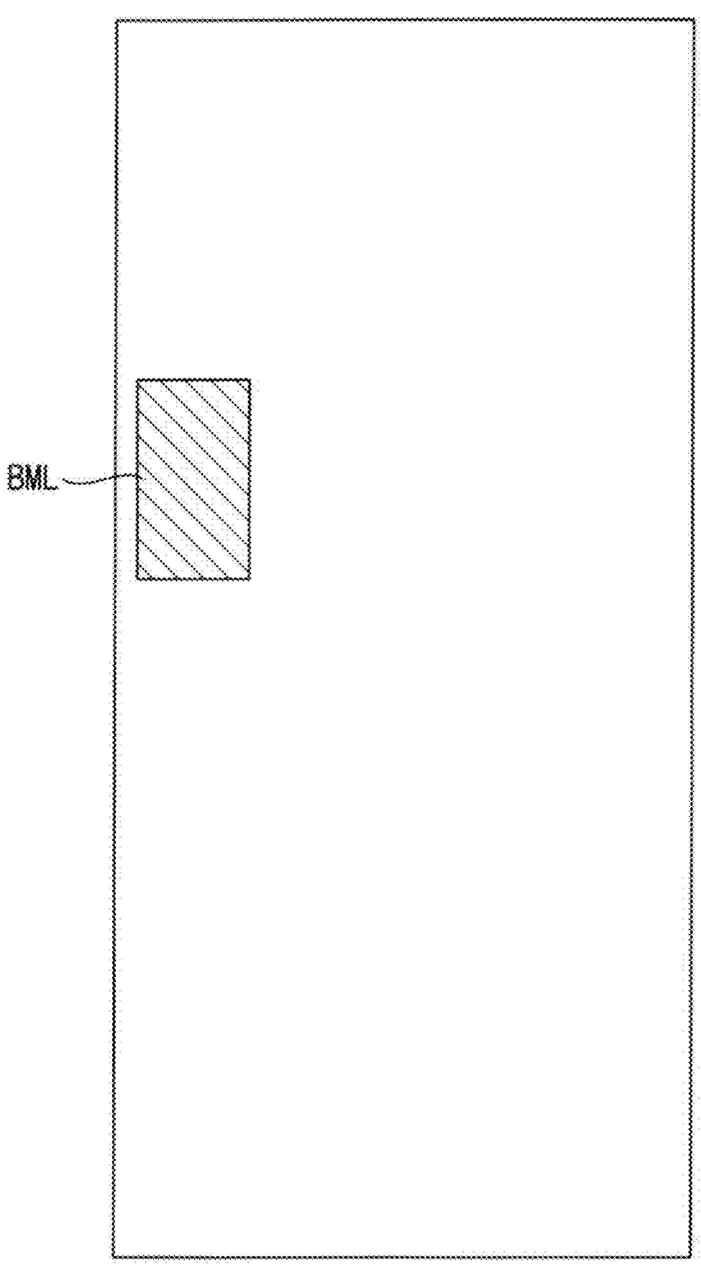
FIG. 6 is a plan view illustrating a lower pattern in FIG. 5.
Figure 6:
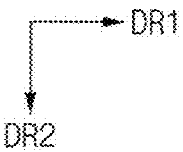
Figure 7:
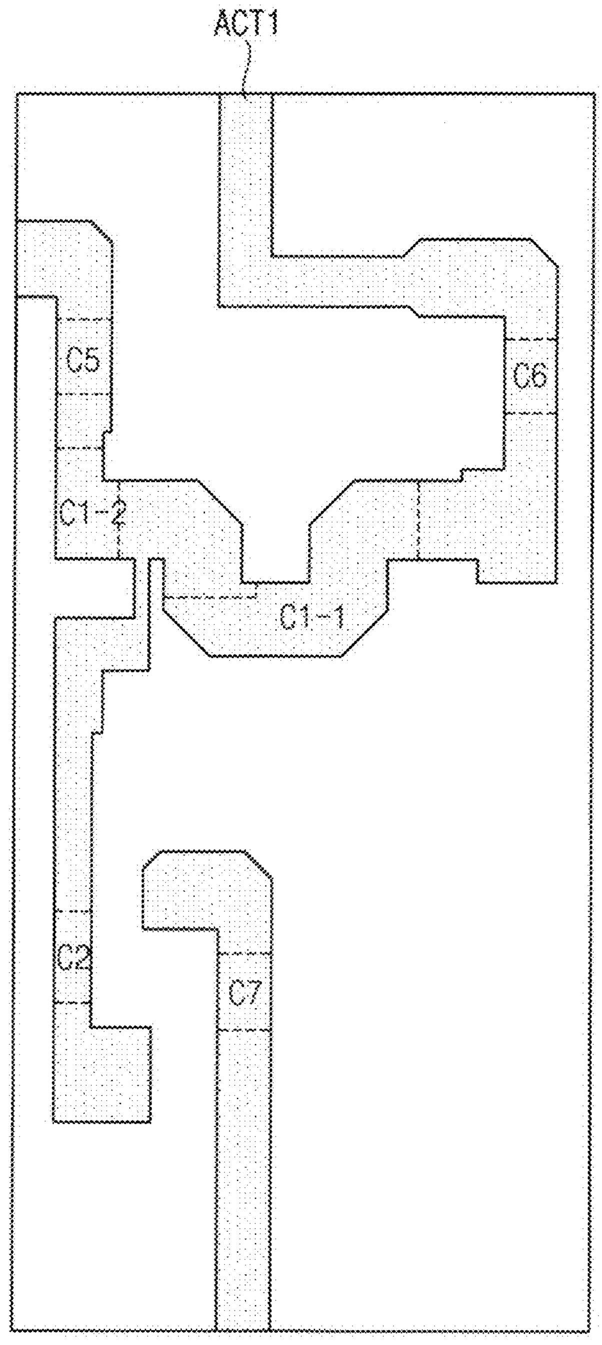
FIG. 7 is a plan view illustrating a first active layer in FIG. 5.
Figure 7:
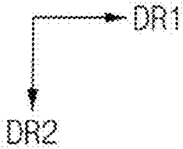
Figure 8:
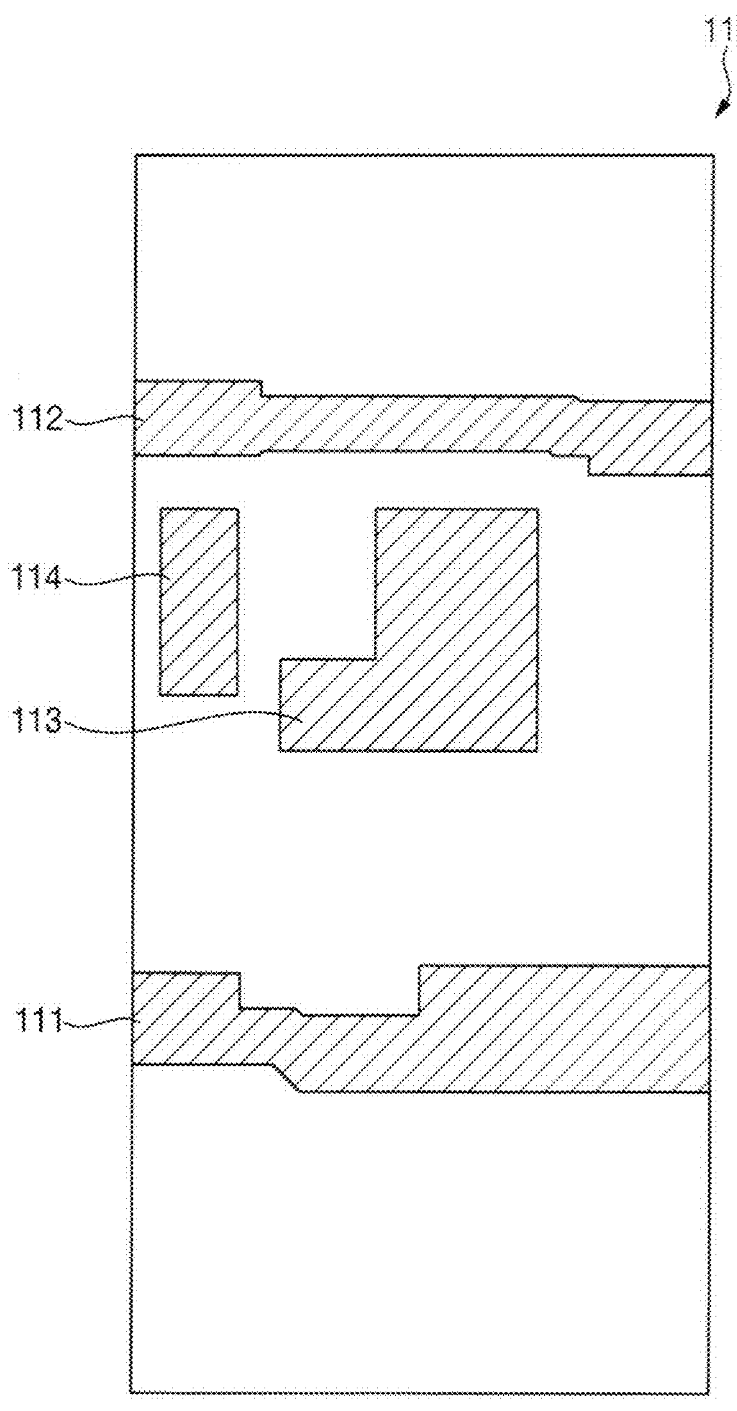
FIG. 8 is a plan view illustrating a first conductive layer in FIG. 5.
Figure 8:
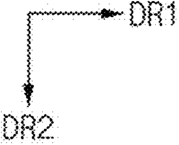
Figure 9:
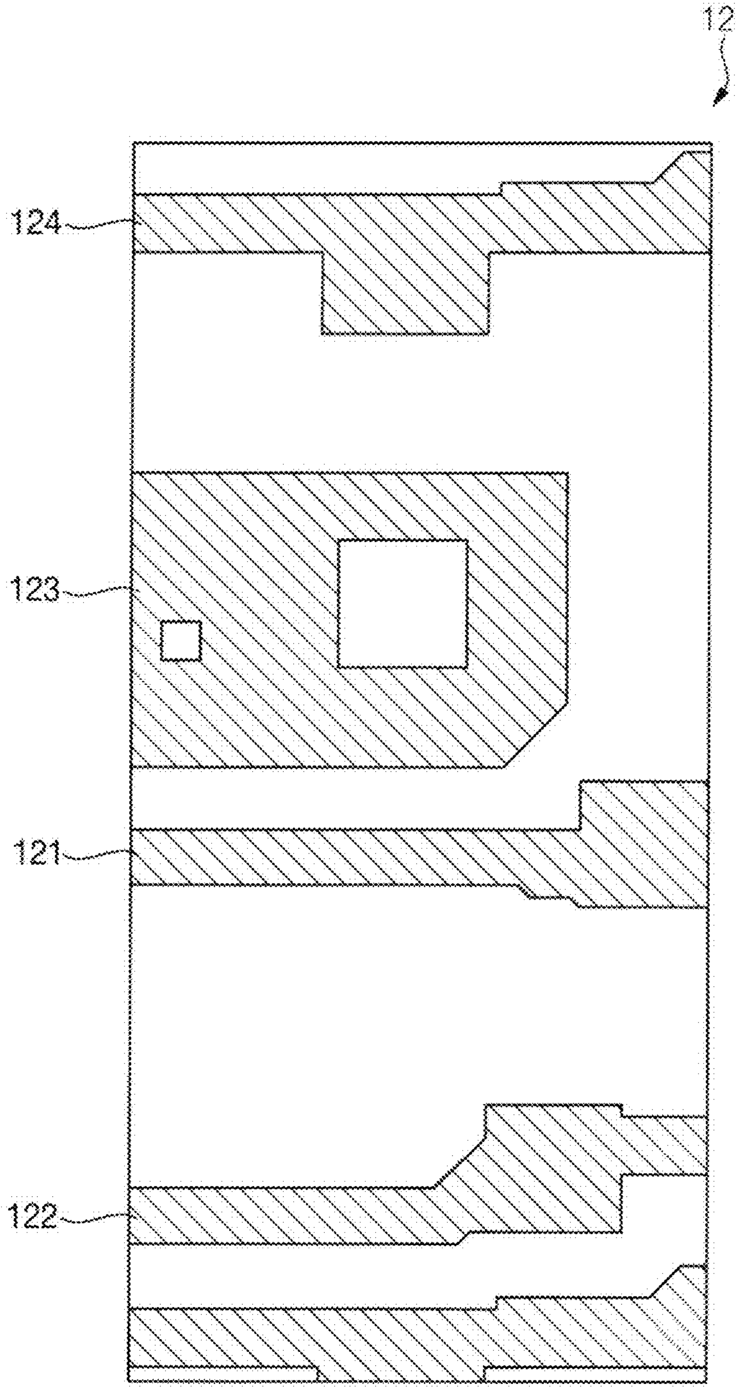
FIG. 9 is a plan view illustrating a second conductive layer in FIG. 5.
Figure 9:
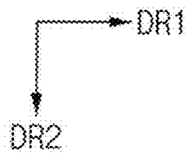
Figure 10:
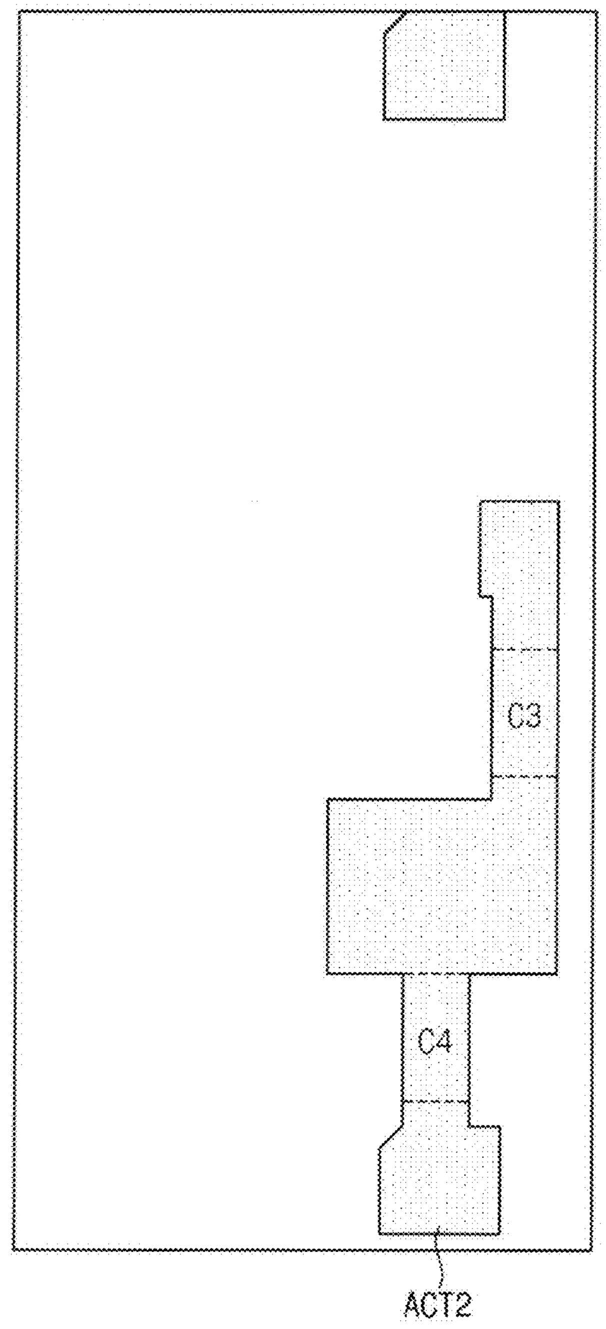
FIG. 10 is a plan view illustrating a second active layer in FIG. 5.
Figure 10:
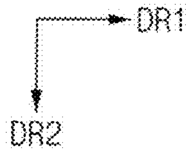
Figure 11:
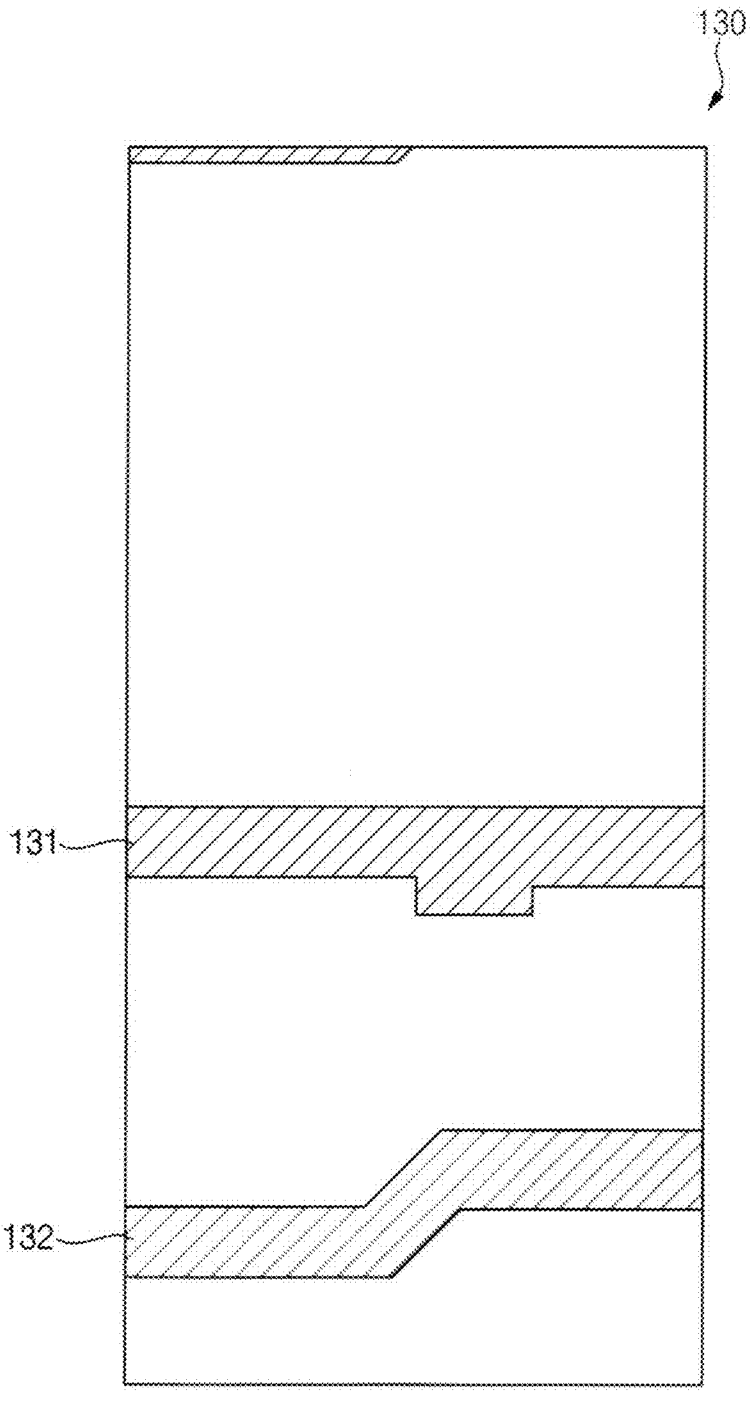
FIG. 11 is a plan view illustrating a third conductive layer in FIG. 5.
Figure 11:
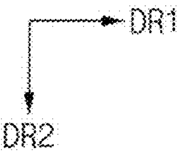
Figure 12:
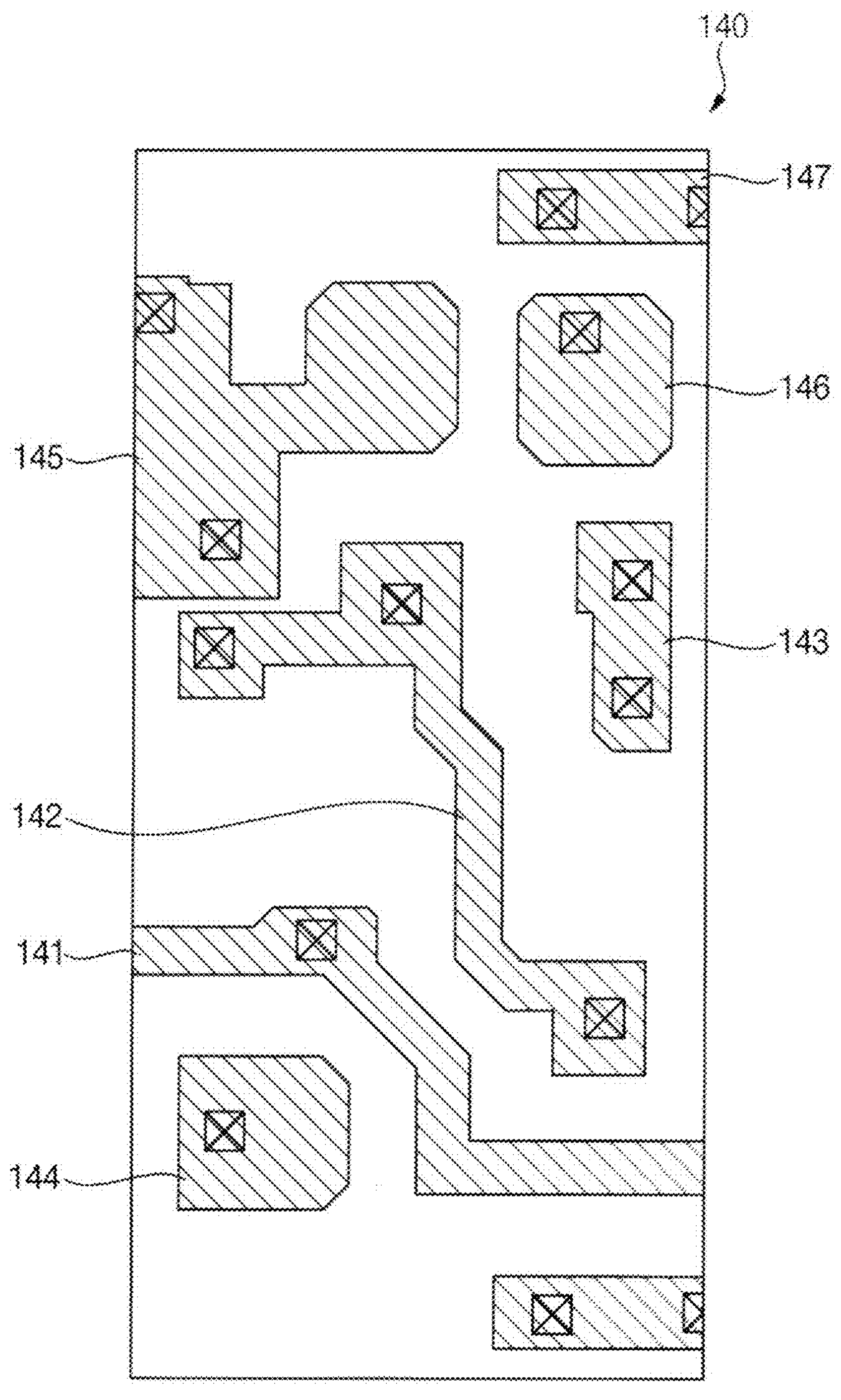
FIG. 12 is a plan view illustrating a fourth conductive layer in FIG. 5.
Figure 12:
Figure 13:
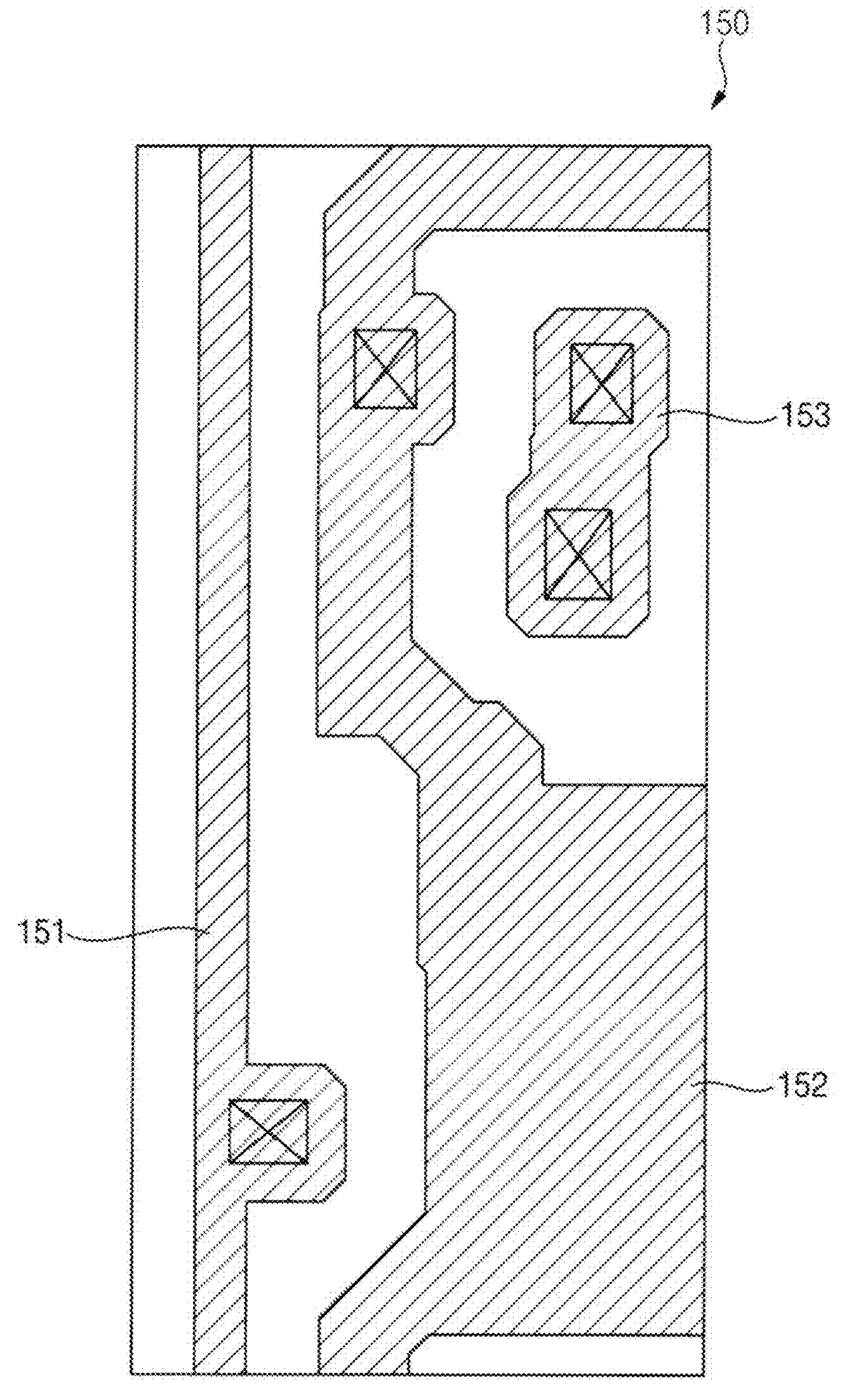
FIG. 13 is a plan view illustrating a fifth conductive layer in FIG. 5.
Figure 13:
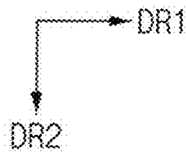

FIG. 5 is a plan view illustrating the pixel PX in FIG. 1. FIG. 6 is a plan view illustrating a lower pattern BML in FIG. 5. FIG. 7 is a plan view illustrating a first active layer ACT1 in FIG. 5. FIG. 8 is a plan view illustrating a first conductive layer 110 in FIG. 5. FIG. 9 is a plan view illustrating a second conductive layer 120 in FIG. 5. FIG. 10 is a plan view illustrating a second active layer ACT2 in FIG. 5. FIG. 11 is a plan view illustrating a third conductive layer 130 in FIG. 5. FIG. 12 is a plan view illustrating a fourth conductive layer 140 in FIG. 5. FIG. 13 is a plan view illustrating a fifth conductive layer 150 in FIG. 5. FIG. 14 is a cross-sectional view illustrating the pixel PX taken along line I-I' in FIG. 5. As used herein, the "plan view" means a view from a direction perpendicular to a plane defined by the first direction DR1 and the second direction DR2.

Referring to FIGS. 5, 6, 7, 8, 9, 10, 11, 12, 13, and 14, the pixel PX may include a substrate SUB, a lower pattern BML, a first active layer ACT1, a first conductive layer 110, a second conductive layer 120, a second active layer ACT2, a third conductive layer 130, a fourth conductive layer 140, a fifth conductive layer 150, a first electrode 160, an emission layer 170, and a second electrode 180.

The substrate SUB may be an insulating substrate including glass, quartz, plastic, or the like. In an embodiment, the substrate SUB may include at least one organic layer. For example, the substrate SUB may include a first organic layer PI1, a first barrier layer BAR1 disposed on the first organic layer PI1, and a second organic layer PI2 disposed on the first barrier layer BAR1. Each of the first organic layer PI1 and the second organic layer PI2 may include an organic insulating material such as polyimide ("PI") or the like. The first barrier layer BAR1 may include an inorganic insulating material such as silicon oxide, silicon nitride, amorphous silicon, or the like.

The lower pattern BML may be disposed on the substrate SUB. The lower pattern BML may include a conductive material such as molybdenum (Mo), copper (Cu), aluminum (Al), titanium (Ti), or the like.

In an embodiment, the lower pattern BML may transmit the emission control signal EM in FIG. 1.

A second barrier layer BAR2 may be disposed on the lower pattern BML. The second barrier layer BAR2 may block impurities such as oxygen, moisture, etc. from diffusing above the substrate SUB through the substrate SUB. Further, the second barrier layer BAR2 may provide a flat upper surface on the substrate SUB. The second barrier layer BAR2 may include an inorganic insulating material such as silicon oxide, silicon nitride, silicon oxynitride, or the like.

A buffer layer BUF may be disposed on the second barrier layer BAR2. The buffer layer BUF may block impurities such as oxygen, moisture, etc. from diffusing above the second barrier layer BAR2 through the second barrier layer BAR2. Further, the buffer layer BUF may provide a flat upper surface on the substrate SUB. The buffer layer BUF may include an inorganic insulating material such as silicon oxide, silicon nitride, silicon oxynitride, or the like.

The first active layer ACT1 may be disposed on the buffer layer BUF. The first active layer ACT1 may include a first driving channel C1-1, a second driving channel C1-2, a second channel C2, a fifth channel C5, a sixth channel C6, and a seventh channel C7 which are spaced apart from each other. The second driving channel C1-2 may overlap the lower pattern BML in a plan view. In an embodiment, a maximum length of the first driving channel C1-1 may be greater than a maximum length of each of the second driving channel C1-2, a length of the second channel C2, a length of the fifth channel C5, a length of the sixth channel C6, and a length of the seventh channel C7 in a plan view (See FIG. 7).

A first insulation layer 101 may be disposed on the first active layer ACT1. The first insulation layer 101 may include an inorganic insulating material such as silicon oxide, silicon nitride, silicon oxynitride, or the like.

The first conductive layer 110 may be disposed on the first insulation layer 101. The first conductive layer 110 may include a conductive material such as molybdenum (Mo), copper (Cu), aluminum (Al), titanium (Ti), or the like.

The first conductive layer 110 may include a write gate line 111, an emission control line 112, a first gate pattern 113, and a second gate pattern 114. The write gate line 111 may extend in a first direction DR1. The emission control line 112 may be spaced apart from the write gate line 111 in the second direction DR2, and may extend in the first direction DR1. The first gate pattern 113 may overlap the first driving channel C1-1 of the first active layer ACT1 in a plan view. The second gate pattern 114 may be spaced apart from the first gate pattern 113 (e.g., in the first direction DR1), and may overlap the second driving channel C1-2 of the first active layer ACT1 in a plan view. In an embodiment, an area of the first gate pattern 113 may be greater than an area of the second gate pattern 114 in a plan view.

A first portion of the write gate line 111 overlapping the second channel C2 of the first active layer ACT1 in a plan view may correspond to the gate electrode of the second transistor T2. A second portion of the write gate line 111 overlapping the seventh channel C7 of the first active layer ACT1 may correspond to the gate electrode of the seventh transistor T7. In an embodiment, when the pixel PX is included in the N-th pixel row, the second portion of the write gate line 111 may correspond to the gate electrode of the seventh transistor T7 of the pixel included in the (N+1)-th pixel row (See FIG. 7). Accordingly, the first active layer ACT1 and the first portion of the write gate line 111 may form the second transistor T2, and the first active layer ACT1 and the second portion of the write gate line 111 may form the seventh transistor T7.

A first portion of the emission control line 112 overlapping the fifth channel C5 of the first active layer ACT1 in a plan view may correspond to the gate electrode of the fifth transistor T5. A second portion of the emission control line 112 overlapping the sixth channel C6 of the first active layer ACT1 in a plan view may correspond to the gate electrode of the sixth transistor T6. Accordingly, the first active layer ACT1 and the first portion of the emission control line 112 may form the fifth transistor T5, and the first active layer ACT1 and the second portion of the emission control line 112 may form the sixth transistor T6.

A portion of the first gate pattern 113 overlapping the first driving channel C1-1 of the first active layer ACT1 in a plan view may correspond to the gate electrode of the first driving transistor T1-1. Accordingly, the first active layer ACT1 and the portion of the first gate pattern 113 may form the first driving transistor T1-1.

A portion of the second gate pattern 114 overlapping the second driving channel C1-2 of the first active layer ACT1 in a plan view may correspond to the gate electrode of the second driving transistor T1-2. Further, a first portion of the lower pattern BML overlapping the second driving channel C1-2 of the first active layer ACT1 in a plan view may correspond to the lower gate electrode of the second driving transistor T1-2. Accordingly, the first portion of the lower pattern BML, the first active layer ACT1, and the portion of the second gate pattern 114 may form the second driving transistor T1-2.

A second insulation layer 102 may be disposed on the first conductive layer 110. The second insulation layer 102 may include an inorganic insulating material such as silicon oxide, silicon nitride, silicon oxynitride, or the like.

The second conductive layer 120 may be disposed on the second insulation layer 102. The second conductive layer 120 may include a conductive material such as molybdenum (Mo), copper (Cu), aluminum (Al), titanium (Ti), or the like.

The second conductive layer 120 may include a first compensation gate line 121, a first initialization gate line 122, a capacitor pattern 123, and a first initialization voltage line 124. The first compensation gate line 121 may extend in the first direction DR1. The first initialization gate line 122 may be spaced apart from the first compensation gate line 121 in the second direction DR2, and may extend substantially in the first direction DR1. The capacitor pattern 123 may be spaced apart from the first compensation gate line 121 in the second direction DR2. The first initialization voltage line 124 may be spaced apart from the first initialization gate line 122 in the second direction DR2, and may extend in the first direction DR1.

The capacitor pattern 123 may overlap the first gate pattern 113 and the second gate pattern 114 in a plan view. The first gate pattern 113 and the capacitor pattern 123 may form a portion of the storage capacitor CST in a region where the first gate pattern 113 and the capacitor pattern 123 overlap, and the second gate pattern 114 and the capacitor pattern 123 may form another portion of the storage capacitor CST in a region where the second gate pattern 114 and the capacitor pattern 123 overlap in a plan view. In an embodiment, an area of the capacitor pattern 123 may be greater than the sum of the area of the first gate pattern 113 and the area of the second gate pattern 114 in a plan view.

A third insulation layer 103 may be disposed on the second conductive layer 120. The third insulation layer 103 may include an inorganic insulating material such as silicon oxide, silicon nitride, silicon oxynitride, or the like.

The second active layer ACT2 may be disposed on the third insulation layer 103. The second active layer ACT2 may not overlap the first active layer ACT1 in a plan view. A material of the first active layer ACT1 may be different from a material of the second active layer ACT2. In an embodiment, the first active layer ACT1 may include at least one of amorphous silicon and polysilicon, and the second active layer ACT2 may include an oxide semiconductor. However, the present invention is not limited thereto, and in another embodiment, the first active layer ACT1 may include an oxide semiconductor, and the second active layer ACT2 may include at least one of amorphous silicon and polysilicon.

The second active layer ACT2 may include a third channel C3 and a fourth channel C4 which are spaced apart from each other in a plan view. The third channel C3 may overlap the first compensation gate line 121, and the fourth channel C4 may overlap the first initialization gate line 122 in a plan view.

A fourth insulation layer 104 may be disposed on the second active layer ACT2. The fourth insulation layer 104 may include an inorganic insulating material such as silicon oxide, silicon nitride, silicon oxynitride, or the like.

The third conductive layer 130 may be disposed on the fourth insulation layer 104. The third conductive layer 130 may include a conductive material such as molybdenum (Mo), copper (Cu), aluminum (Al), titanium (Ti), or the like.

The third conductive layer 130 may include a second compensation gate line 131 and a second initialization gate line 132. The second compensation gate line 131 may extend in the first direction DR1. The second initialization gate line 132 may be spaced apart from the second compensation gate line 131 in the second direction DR2, and may extend substantially in the first direction DR1. The second compensation gate line 131 and the second initialization gate line 132 may overlap the first compensation gate line 121 and the first initialization gate line 122, respectively.

A portion of the first compensation gate line 121 overlapping the third channel C3 of the second active layer ACT2 in a plan view may correspond to a lower gate electrode of the third transistor T3. A portion of the second compensation gate line 131 overlapping the third channel C3 of the second active layer ACT2 in a plan view may correspond to an upper gate electrode of the third transistor T3. Accordingly, the portion of the first compensation gate line 121, the second active layer ACT2, and the portion of the second compensation gate line 131 may form the third transistor T3. The third transistor T3 may be a transistor having a dual gate structure.

A portion of the first initialization gate line 122 overlapping the fourth channel C4 of the second active layer ACT2 in a plan view may correspond to a lower gate electrode of the fourth transistor T4. A portion of the second initialization gate line 132 overlapping the fourth channel C4 of the second active layer ACT2 in a plan view may correspond to an upper gate electrode of the fourth transistor T4. Accordingly, the portion of the first initialization gate line 122, the second active layer ACT2, and the portion of the second initialization gate line 132 may form the fourth transistor T4. The fourth transistor T4 may be a transistor having a dual gate structure.

A fifth insulation layer 105 may be disposed on the third conductive layer 130. The fifth insulation layer 105 may include an inorganic insulating material such as silicon oxide, silicon nitride, silicon oxynitride, etc. and/or an organic insulating material such as polyimide (PI), etc.

The fourth conductive layer 140 may be disposed on the fifth insulation layer 105. The fourth conductive layer 140 may include a conductive material such as aluminum (Al), titanium (Ti), copper (Cu), or the like. In an embodiment, the fourth conductive layer 140 may have a multilayer structure including a titanium layer, an aluminum layer, and a titanium layer which are stacked.

The fourth conductive layer 140 may include a second initialization voltage line 141, a gate connection electrode 142, an active connection electrode 143, a data connection electrode 144, a driving voltage connection electrode 145, a first light emitting element connection electrode 146, and a first initialization voltage connection electrode 147. The second initialization voltage line 141 may extend substantially in the first direction DR1. The second initialization voltage line 141 may be connected to the first active layer ACT1 through a contact hole. Specifically, the second initialization voltage line 141 may be connected to the second electrode of the seventh transistor T7.

The gate connection electrode 142 may be spaced apart from the second initialization voltage line 141. The gate connection electrode 142 may be connected to the first gate pattern 113, the second gate pattern 114, and the second active layer ACT2 through contact holes, respectively. Specifically, the gate connection electrode 142 may connect the gate electrode of the first driving transistor T1-1, the gate electrode of the second driving transistor T1-2, the second electrode of the third transistor T3, and the second electrode of the fourth transistor T4.

The active connection electrode 143 may be spaced apart from the gate connection electrode 142. The active connection electrode 143 may be connected to the first active layer ACT1 and the second active layer ACT2 through contact holes, respectively. Specifically, the active connection electrode 143 may connect the second electrode of the first driving transistor T1-1, the first electrode of the third transistor T3, and the first electrode of the sixth transistor T6.

The data connection electrode 144 may be spaced apart from the active connection electrode 143. The data connection electrode 144 may be connected to the first active layer ACT1 through a contact hole. Specifically, the data connection electrode 144 may be connected to the first electrode of the second transistor T2.

The driving voltage connection electrode 145 may be spaced apart from the data connection electrode 144. The driving voltage connection electrode 145 may be connected to the first active layer ACT1 and the capacitor pattern 123 through contact holes, respectively. Specifically, the driving voltage connection electrode 145 may be connected to the first electrode of the fifth transistor T5 and the second electrode of the storage capacitor CST.

The first light emitting element connection electrode 146 may be spaced apart from the driving voltage connection electrode 145 in the first direction DR1. The first light emitting element connection electrode 146 may be connected to the first active layer ACT1 through a contact hole. Specifically, the first light emitting element connection electrode 146 may be connected to the second electrode of the sixth transistor T6.

The first initialization voltage connection electrode 147 may be spaced apart from the first light emitting element connection electrode 146 in the second direction DR2. The first initialization voltage connection electrode 147 may be connected to the first initialization voltage line 124 and the second active layer ACT2 through contact holes, respectively. Specifically, the first initialization voltage connection electrode 147 may be connected to the first electrode of the fourth transistor T4.

A sixth insulation layer 106 may be disposed on the fourth conductive layer 140. The sixth insulation layer 106 may include an inorganic insulating material such as silicon oxide, silicon nitride, silicon oxynitride, etc. and/or an organic insulating material such as polyimide (PI), etc.

The fifth conductive layer 150 may be disposed on the sixth insulation layer 106. The fifth conductive layer 150 may include a conductive material such as aluminum (Al), titanium (Ti), copper (Cu), or the like. In an embodiment, the fifth conductive layer 150 may have a multilayer structure including a titanium layer, an aluminum layer, and a titanium layer which are stacked.

The fifth conductive layer 150 may include a data line 151, a driving voltage line 152, and a second light emitting element connection electrode 153. The data line 151 may extend in the second direction DR2. The data line 151 may be connected to the data connection electrode 144 through a contact hole. Accordingly, the data line 151 may be connected to the first electrode of the second transistor T2 through the data connection electrode 144.

The driving voltage line 152 may be spaced apart from the data line 151 in the first direction DR1, and may extend substantially in the second direction DR2. The driving voltage line 152 may be connected to the driving voltage connection electrode 145 through a contact hole. Accordingly, the driving voltage line 152 may be connected to the first electrode of the fifth transistor T5 and the second electrode of the storage capacitor CST through the driving voltage connection electrode 145.

The second light emitting element connection electrode 153 may be spaced apart from the driving voltage line 152. The second light emitting element connection electrode 153 may be connected to the first light emitting element connection electrode 146 through a contact hole.

A seventh insulation layer 107 may be disposed on the fifth conductive layer 150. The seventh insulation layer 107 may include an inorganic insulating material such as silicon oxide, silicon nitride, silicon oxynitride, etc. and/or an organic insulating material such as polyimide (PI), etc.

The first electrode 160 may be disposed on the seventh insulation layer 107. The first electrode 160 may include a conductive material such as a metal, an alloy, a transparent conductive oxide, or the like. For example, the first electrode 160 may include silver (Ag), indium tin oxide ("ITO"), or the like. In an embodiment, the first electrode 160 may have a multilayer structure including an indium-tin-oxide layer, a silver layer, and an indium-tin-oxide layer which are stacked in this order.

The first electrode 160 may be connected to the second light emitting element connection electrode 153 through a contact hole. Accordingly, the first electrode 160 may be connected to the second electrode of the sixth transistor T6 through the first light emitting element connection electrode 146 and the second light emitting element connection electrode 153.

An eighth insulation layer 108 may be disposed on the first electrode 160. The eighth insulation layer 108 may cover the first electrode 160, and may be disposed on the seventh insulation layer 107. The eighth insulation layer 108 may define a pixel opening exposing at least a portion of the first electrode 160. In an embodiment, the pixel opening may expose a central portion of the first electrode 160, and the eighth insulation layer 108 may cover a peripheral portion of the first electrode 160. The eighth insulation layer 108 may include an organic insulating material such as polyimide (PI) or the like.

The emission layer 170 may be disposed on the first electrode 160. The emission layer 170 may be disposed on the first electrode 160 exposed by the pixel opening. The emission layer 170 may include at least one of an organic light emitting material and a quantum dot.

In an embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, or the like, and the high molecular weight organic compound may include poly(3,4-ethylenedioxythiophene), polyaniline, polyphenylenevinylene, polyfluorene, or the like.

In an embodiment, the quantum dot may include a core including a group II-VI compound, a group III-V compound, a group IV-VI compound, a group IV element, a group IV compound, or combinations thereof. In an embodiment, the quantum dot may have a core-shell structure including a core and a shell surrounding the core. The shell may serve as a protective layer for maintaining semiconductor properties by preventing chemical modification of the core and as a charging layer for imparting electrophoretic properties to the quantum dot.

The second electrode 180 may be disposed on the emission layer 170. In an embodiment, the second electrode 180 may also be disposed on the eighth insulation layer 108. The second electrode 180 may include a conductive material such as a metal, an alloy, a transparent conductive oxide, or the like. For example, the second electrode 180 may include aluminum (Al), platinum (Pt), silver (Ag), magnesium (Mg), gold (Au), chromium (Cr), tungsten (W), titanium (Ti), or the like. The first electrode 160, the emission layer 170, and the second electrode 180 may form the light emitting element EL.

Figure 15:
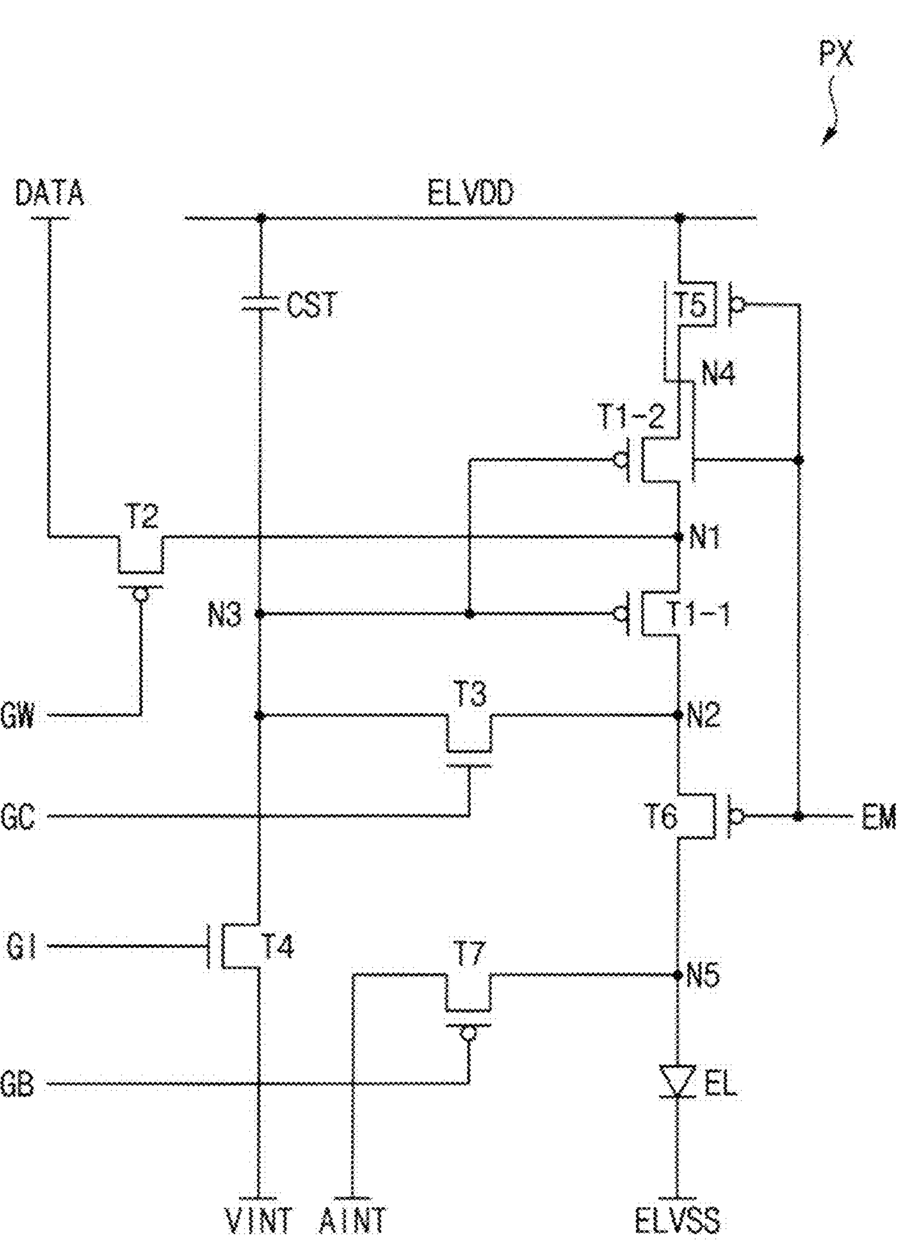
FIG. 15 is a circuit diagram illustrating a pixel of a display device according to another embodiment.

FIG. 15 is a circuit diagram illustrating a pixel PX of a display device according to another embodiment.

A pixel PX described with reference to FIG. 15 may be substantially the same as or similar to the pixel PX described with reference to FIG. 1 except for the fifth transistor T5. Accordingly, a description of the repeated components will be omitted.

Referring to FIG. 15, the fifth transistor T5 may include a first electrode which receives the driving voltage ELVDD, a second electrode connected to the fourth node N4, a gate electrode which receives the emission control signal EM, and a lower gate electrode which receives the emission control signal EM. Accordingly, the fifth transistor T5 may be a dual gate transistor. As the fifth transistor T5 is formed as the dual gate transistor, characteristics of the fifth transistor T5 may be improved.

Figure 16:
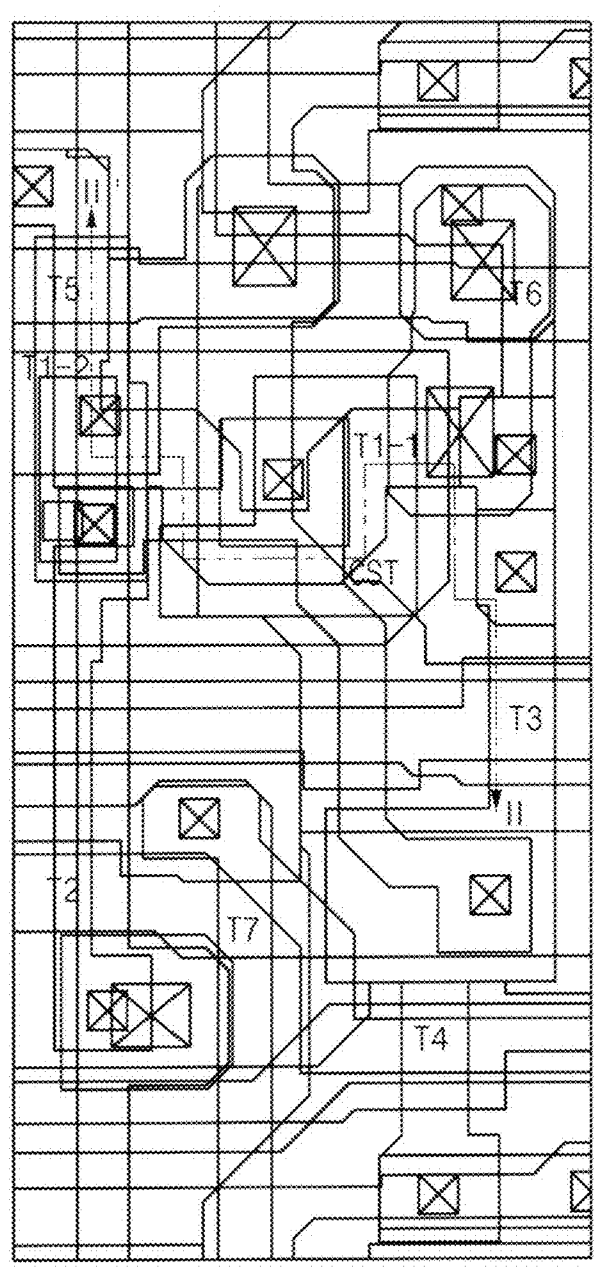
FIG. 16 is a plan view illustrating the pixel in FIG. 15.
Figure 16:
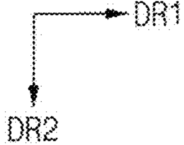
Figure 17:
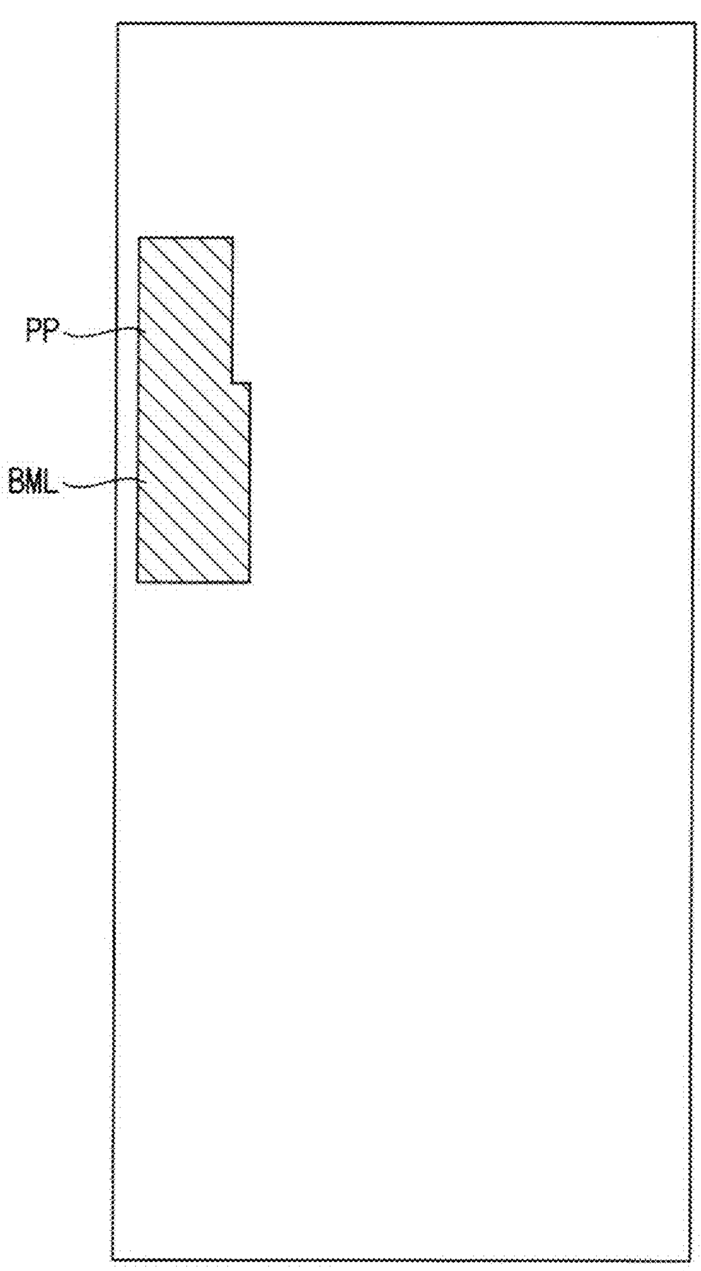
FIG. 17 is a plan view illustrating a lower pattern in FIG. 16.
Figure 17:
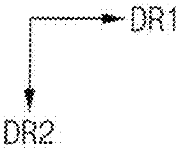
Figure 18:
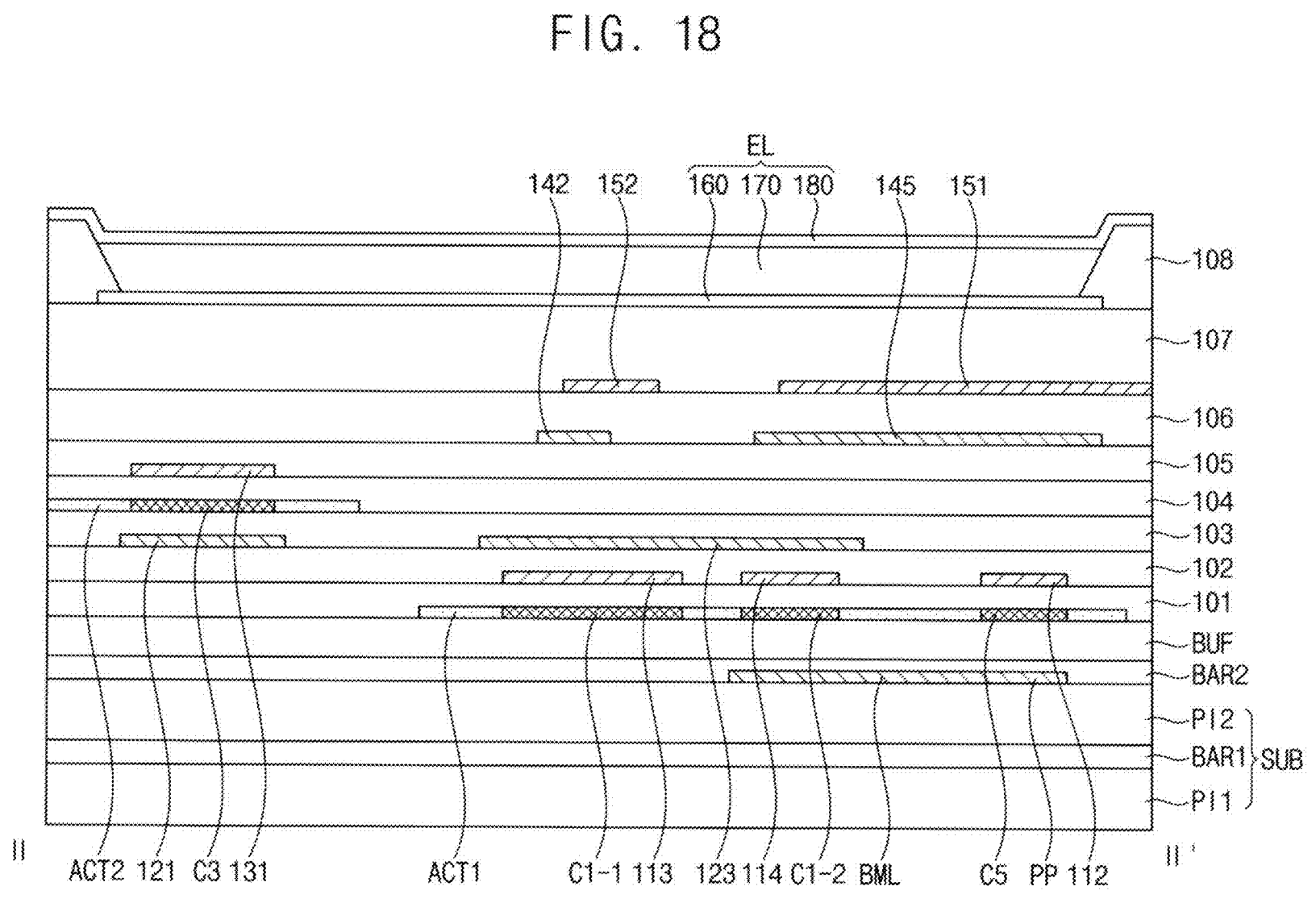

FIG. 16 is a plan view illustrating the pixel PX in FIG. 15. FIG. 17 is a plan view illustrating a lower pattern BML in FIG. 16. FIG. 18 is a cross-sectional view illustrating the pixel PX taken along line II-IF in FIG. 16.

The pixel PX described with reference to FIGS. 16 to 18 may be substantially the same as or similar to the pixel PX described with reference to FIGS. 5 to 14 except for the lower pattern BML. Accordingly, a description of the repeated components will be omitted.

Referring to FIGS. 16, 17, and 18, the lower pattern BML may include an extending portion PP overlapping the fifth channel C5 of the first active layer ACT1 in a plan view. A second portion of the lower pattern BML overlapping the fifth channel C5 of the first active layer ACT1 in a plan view may correspond to the lower gate electrode of the fifth transistor T5. Accordingly, the second portion of the lower pattern BML, the first active layer ACT1, the first portion of the emission control line 112 overlapping and the fifth channel C5 of the first active layer ACT1 in a plan view may form the fifth transistor T5.

When an electric field is formed between the second driving and fifth channels C1-2 and C5 and the emission control line 112 through the substrate SUB, negative charges may be accumulated under the second driving and fifth channels C1-2 and C5 due to the polarization of the first organic layer PI1 and/or the second organic layer PI2 of the substrate SUB, and thus, the characteristics (e.g., driving range) of the second driving and fifth transistors T1-2 and T5 may be changed, and the brightness of light emitted from the light emitting element EL may be changed. When the lower pattern BML includes the extending portion PP overlapping the fifth channel C5 of the first active layer ACT1 in a plan view, the lower pattern BML may prevent the electric field from being formed between the second driving and fifth channels C1-2 and C5 and the emission control line 112. Accordingly, characteristics (e.g., driving range) of the second driving and fifth transistors T1-2 and T5 may not change, and the brightness of light emitted from the light emitting element EL may constantly maintain.

Figure 19:
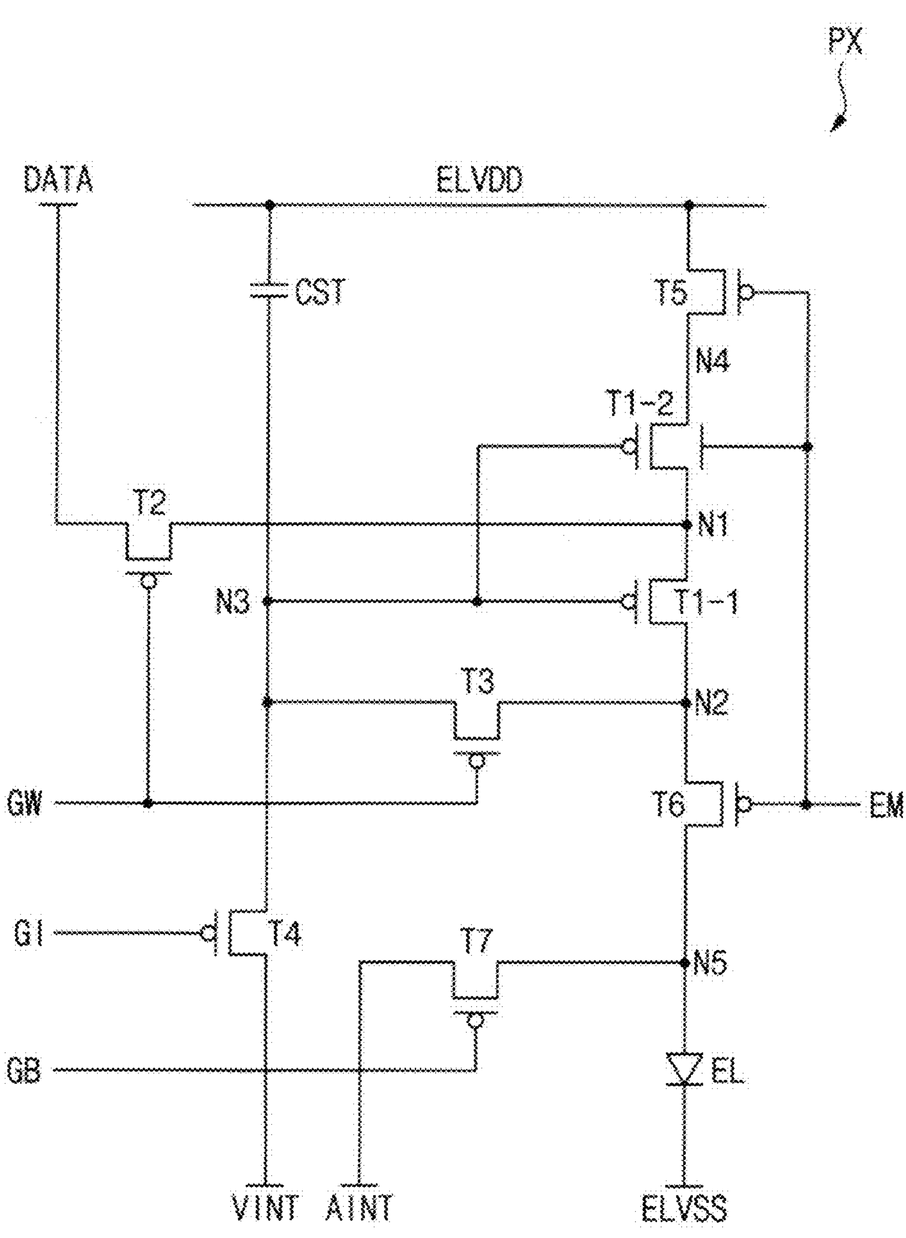
FIG. 19 is a circuit diagram illustrating a pixel of a display device according to an embodiment.

FIG. 19 is a circuit diagram illustrating a pixel PX of a display device according to an embodiment.

A pixel PX described with reference to FIG. 19 may be substantially the same as or similar to the pixel PX described with reference to FIG. 1 except for the third transistor T3 and the fourth transistor T4. Accordingly, a description of the repeated components will be omitted.

Referring to FIG. 19, the third transistor T3 may include a first electrode connected to the second node N2, a second electrode connected to the third node N3, and a gate electrode which receives the write gate signal GW. The third transistor T3 may compensate the threshold voltage of the first driving transistor T1-1 by diode-connecting the second node N2 and the third node N3 in response to the write gate signal GW.

The fourth transistor T4 may include a first electrode connected to the third node N3, a second electrode which receives the first initialization voltage VINT, and a gate electrode which receives the initialization gate signal GI. The fourth transistor T4 may initialize the gate electrode of the first driving transistor T1-1 and the gate electrode of the second driving transistor T1-2 in response to the initialization gate signal GI.

In an embodiment, an active layer of each of the first driving transistor T1-1, the second driving transistor T1-2, the second transistor T2, the third transistor T3, the fourth transistor T4, the fifth transistor T5, the sixth transistor T6, and the seventh transistor T7 may be formed of or include amorphous silicon or polysilicon. In an embodiment, each of the first driving transistor T1-1, the second driving transistor T1-2, the second transistor T2, the third transistor T3, the fourth transistor T4, the fifth transistor T5, the sixth transistor T6, and the seventh transistor T7 may be a PMOS transistor.

In a compensation period, the data voltage DATA may be applied to the gate electrode of the first driving transistor T1-1 along the second transistor T2, the first driving transistor T1-1, and the third transistor T3 in response to the write gate signal GW. Specifically, in the compensation period, the write gate signal GW of a gate-on level may be applied to the gate electrode of the second transistor T2 and the gate electrode of the third transistor T3 to turn on the second transistor T2 and the second transistor T3, the data voltage DATA may be applied to the third node N3, and the first driving transistor T1-1 may be diode-connected. Accordingly, the threshold voltage of the first driving transistor T1-1 may be compensated.

The display device according to the embodiments may be applied to a display device included in a computer, a notebook, a mobile phone, a smart phone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device, comprising:

a plurality of pixels each including:

a first driving transistor including a first electrode connected to a first node, a second electrode connected to a second node, and a gate electrode connected to a third node;

a second driving transistor including a first electrode connected to a fourth node, a second electrode connected to the first node, a gate electrode connected to the third node, and a lower gate electrode which receives an emission control signal;

a second transistor including a first electrode which receives a data voltage, a second electrode connected to the first node, and a gate electrode which receives a write gate signal;

a third transistor including a first electrode connected to the second node, a second electrode connected to the third node, and a gate electrode which receives the write gate signal or a compensation gate signal; and a fifth transistor including a first electrode which receives a driving voltage, a second electrode connected to the fourth node, a gate electrode which receives the emission control signal, and a lower gate electrode physically and directly connected to the lower gate electrode of the second driving transistor, wherein the lower gate electrode of the fifth transistor receives the emission control signal through the lower gate electrode of the second driving transistor.

2. The display device of claim 1, wherein, in a compensation period, the data voltage is applied to the gate electrode of the first driving transistor along the second transistor, the first driving transistor, and the third transistor in response to the write gate signal or both the write gate signal and the compensation gate signal.

3. The display device of claim 2, wherein, in the compensation period, a threshold voltage of the first driving transistor is compensated.

4. The display device of claim 1, wherein each of the pixels further includes:

a fourth transistor including a first electrode which receives a first initialization voltage, a second electrode connected to the third node, and a gate electrode which receives an initialization gate signal.

5. The display device of claim 4, wherein, in an initialization period, the first initialization voltage initializes the gate electrode of the first driving transistor and the gate electrode of the second driving transistor in response to the initialization gate signal.

6. The display device of claim 4, wherein each of the third transistor and the fourth transistor is an NMOS transistor.

7. The display device of claim 4, wherein each of the third transistor and the fourth transistor is a PMOS transistor.

8. The display device of claim 1, wherein each of the pixels further includes:

a sixth transistor including a first electrode connected to the second node, a second electrode connected to a fifth node, and a gate electrode which receives the emission control signal.

9. The display device of claim 8, wherein each of the pixels further includes:

a light emitting element including a first electrode connected to the fifth node and a second electrode which receives a common voltage.

10. The display device of claim 9, wherein, in an emission period, the driving voltage is applied to the first electrode of the light emitting element along the fifth transistor, the second driving transistor, the first driving transistor, and the sixth transistor in response to the emission control signal.

11. The display device of claim 10, wherein, in the emission period, a threshold voltage of the second driving transistor is about 0 voltage (V).

12. The display device of claim 9, wherein each of the pixels further includes:

a seventh transistor including a first electrode connected to the fifth node, a second electrode which receives a second initialization voltage, and a gate electrode which receives a bypass gate signal.

13. The display device of claim 12, wherein each of the first driving transistor, the second driving transistor, the second transistor, the fifth transistor, the sixth transistor, and the seventh transistor is a PMOS transistor.

14. The display device of claim 1, wherein each of the pixels further includes:

a storage capacitor including a first electrode connected to the third node and a second electrode which receives a driving voltage.

* * * * *